United States Patent
Su et al.

(10) Patent No.: US 11,923,306 B2
(45) Date of Patent: Mar. 5, 2024

(54) SEMICONDUCTOR STRUCTURE HAVING AIR GAPS AND METHOD FOR MANUFACTURING THE SAME

(71) Applicant: TAIWAN SEMICONDUCTOR MANUFACTURING COMPANY, LTD., Hsinchu (TW)

(72) Inventors: Chia-Wei Su, Hsinchu (TW); Chia-Tien Wu, Hsinchu (TW); Hsin-Ping Chen, Hsinchu (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 218 days.

(21) Appl. No.: 17/461,152

(22) Filed: Aug. 30, 2021

(65) Prior Publication Data
US 2023/0067563 A1 Mar. 2, 2023

(51) Int. Cl.
*H01L 23/532* (2006.01)
*H01L 21/311* (2006.01)
*H01L 21/768* (2006.01)
*H01L 23/528* (2006.01)

(52) U.S. Cl.
CPC .... *H01L 23/5329* (2013.01); *H01L 21/31133* (2013.01); *H01L 21/7682* (2013.01); *H01L 21/76832* (2013.01); *H01L 23/5283* (2013.01)

(58) Field of Classification Search
CPC ........... H01L 21/7682; H01L 21/76831; H01L 21/76832; H01L 21/76897; H01L 21/76877; H01L 21/76865; H01L 21/02167; H01L 21/30617; H01L 23/53295
See application file for complete search history.

(56) References Cited

U.S. PATENT DOCUMENTS

| | | | | |
|---|---|---|---|---|
| 9,368,362 | B2* | 6/2016 | Rha | H01L 21/76826 |
| 10,665,546 | B1* | 5/2020 | Lin | H01L 21/76826 |
| 11,183,421 | B2* | 11/2021 | Hsieh | H01L 23/5222 |
| 2009/0309230 | A1* | 12/2009 | Cui | H01L 23/53238 257/773 |
| 2010/0181678 | A1* | 7/2010 | Edelstein | H01L 21/76883 430/311 |

(Continued)

*Primary Examiner* — Jaehwan Oh
*Assistant Examiner* — John M Parker
(74) *Attorney, Agent, or Firm* — Birch, Stewart, Kolasch & Birch, LLP

(57) ABSTRACT

A method for manufacturing a semiconductor structure includes forming a plurality of dummy structures spaced apart from each other, forming a plurality of dielectric spacers laterally covering the dummy structures to form a plurality of trenches defined by the dielectric spacers, filling a conductive material into the trenches to form electrically conductive features, selectively depositing a capping material on the electrically conductive features to form a capping layer, removing the dummy structures to form a plurality of recesses defined by the dielectric spacers, filling a sacrificial material into the recesses so as to form sacrificial features, depositing a sustaining layer on the sacrificial features, and removing the sacrificial features to form air gaps confined by the sustaining layer and the dielectric spacers.

20 Claims, 37 Drawing Sheets

(56) References Cited

U.S. PATENT DOCUMENTS

| | | | |
|---|---|---|---|
| 2012/0319279 A1* | 12/2012 | Isobayashi | H01L 23/53238 |
| | | | 438/653 |
| 2013/0323930 A1* | 12/2013 | Chattopadhyay | ............................ |
| | | | H01L 21/76829 |
| | | | 156/345.26 |
| 2020/0185264 A1* | 6/2020 | Lin | H01L 21/7682 |
| 2021/0193566 A1* | 6/2021 | Lo | H01L 23/5384 |
| 2022/0115266 A1* | 4/2022 | Huang | H01L 23/5222 |

* cited by examiner

SEMICONDUCTOR STRUCTURE HAVING AIR GAPS AND METHOD FOR MANUFACTURING THE SAME

BACKGROUND

The integration density of various electronic components, such as transistors, diodes, resistors, capacitors, etc., is being improved continuously in the semiconductor industry by continual reduction in minimum feature sizes. As the feature sizes are decreased, the distance between metal features is continually reduced. As the distance between the metal features reduces, the resulting parasitic capacitance between the metal features increases, leading to higher power consumption and larger resistance-capacitance (RC) time delays for an integrated chip. To improve performance and reduce the parasitic capacitance between the metal features, materials having low dielectric (k) values are used. However, such dielectric materials encounter a lot of processing problems that prevent further improvement of the dielectric constant.

The use of air gaps in semiconductor devices to enhance the isolation of the metal features is known in the art of semiconductor fabrication. Since air has a lowest k value (k=1), a growing trend has been to incorporate air gaps into the semiconductor devices to isolate the metal features and reduce line-to-line capacitance and the RC time delay.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
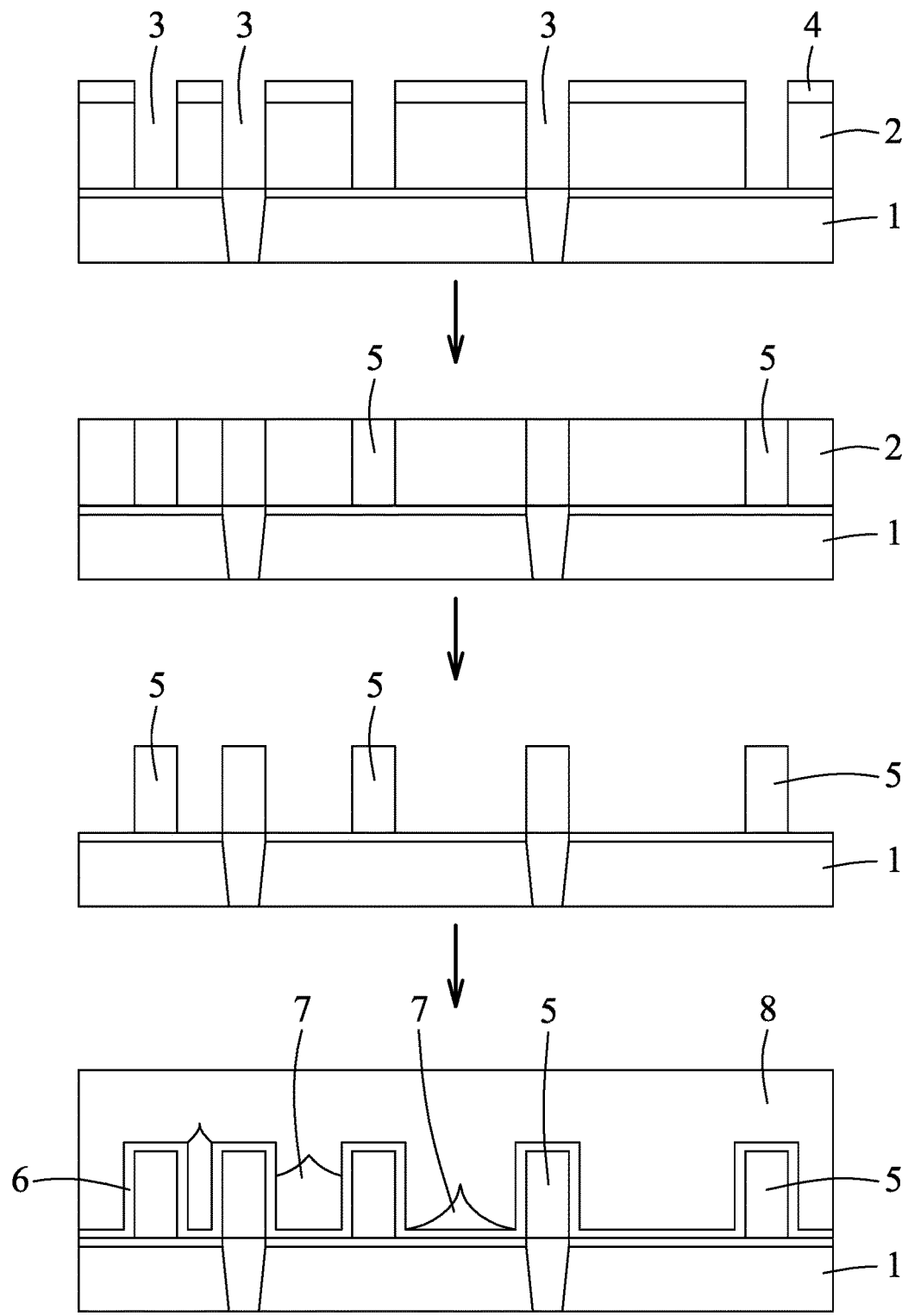
FIG. 1 illustrates schematic views showing intermediate stages of a method for forming air gaps in a semiconductor device using chemical vapor deposition.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, a method for forming air gaps in a semiconductor device using chemical vapor deposition includes the steps of: subjecting a dummy layer 2 disposed above an dielectric layer 1 to patterning through a patterned mask 4 to form a plurality of trenches 3 in the dummy layer 2; filling an electrically conductive material (for example, copper) into the trenches 3 to form electrically conductive features 5; removing the dummy layer 2 by, for example, etching; depositing a cap layer 6 on the electrically conductive features 5 and the dielectric layer 1 by, for example, atomic layer deposition (ALD); and subjecting the cap layer 6 to chemical vapor deposition of a dielectric layer 8 to form air gaps 7 among the electrically conductive features 5. However, the heights and the widths of the air gaps 7 formed by the chemical vapor deposition cannot be well controlled.

Figure 2:
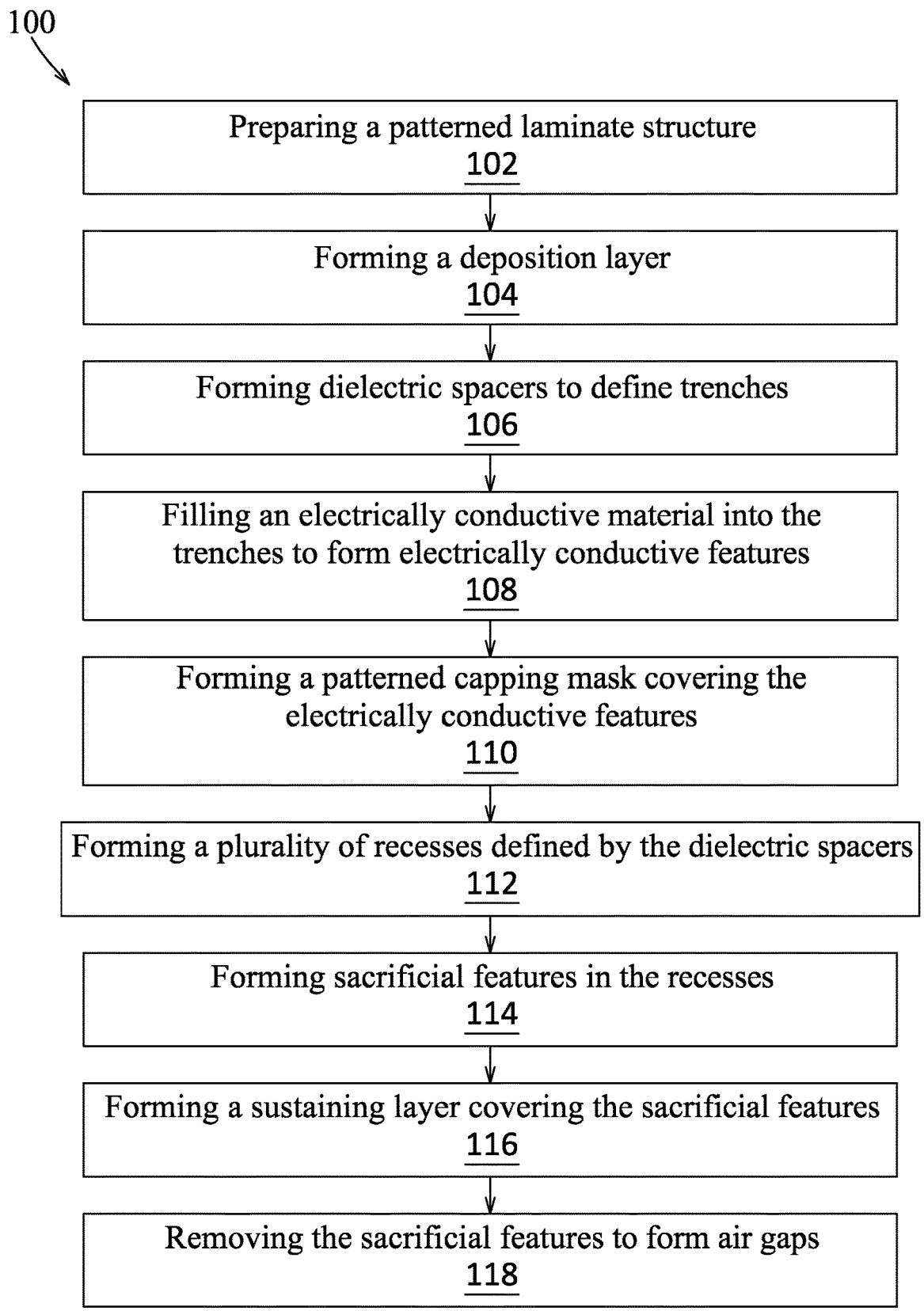
FIG. 2 is a flow diagram illustrating a method for manufacturing a semiconductor structure having air gaps in accordance with some embodiments.

FIG. 2 illustrates a method 100 for manufacturing a semiconductor structure having air gaps in accordance with some embodiments. FIGS. 3 to 19 illustrate schematic views of a semiconductor structure 200 during various stages of the method 100 of FIG. 2. The method 100 and the semiconductor structure 200 are collectively described below. However, additional steps can be provided before, after or during the method 100, and some of the steps described herein may be replaced by other steps or be eliminated. Similarly, further additional features may be present in the semiconductor structure 200, and/or features present may be replaced or eliminated in additional embodiments.

Referring to FIG. 2, the method 100 begins at block 102, where a laminate structure is prepared. Referring to the example illustrated in FIGS. 3 to 5, a laminate structure 10 is prepared on an interconnect layer 11 disposed on a metal layer (Mx) over a substrate 9. An etch stop layer (not shown) may be optionally formed on the interconnect layer 11. The laminate structure 10 may be prepared by subjecting a dummy layer 12 formed on the interconnect layer 11 to an etching treatment, such as wet etching, through a first patterned mask layer 13 and a second patterned mask layer 14, which are formed on the dummy layer 12. Each of the first patterned mask layer 13 and the second patterned mask layer 14 may be a patterned hard mask layer. The laminate structure 10 thus prepared includes a patterned dummy layer 15 disposed on the interconnect layer 11, the first patterned mask layer 13 disposed on the patterned dummy layer 15, and the second patterned mask layer 14 disposed on the first patterned mask layer 13.

Figure 3:
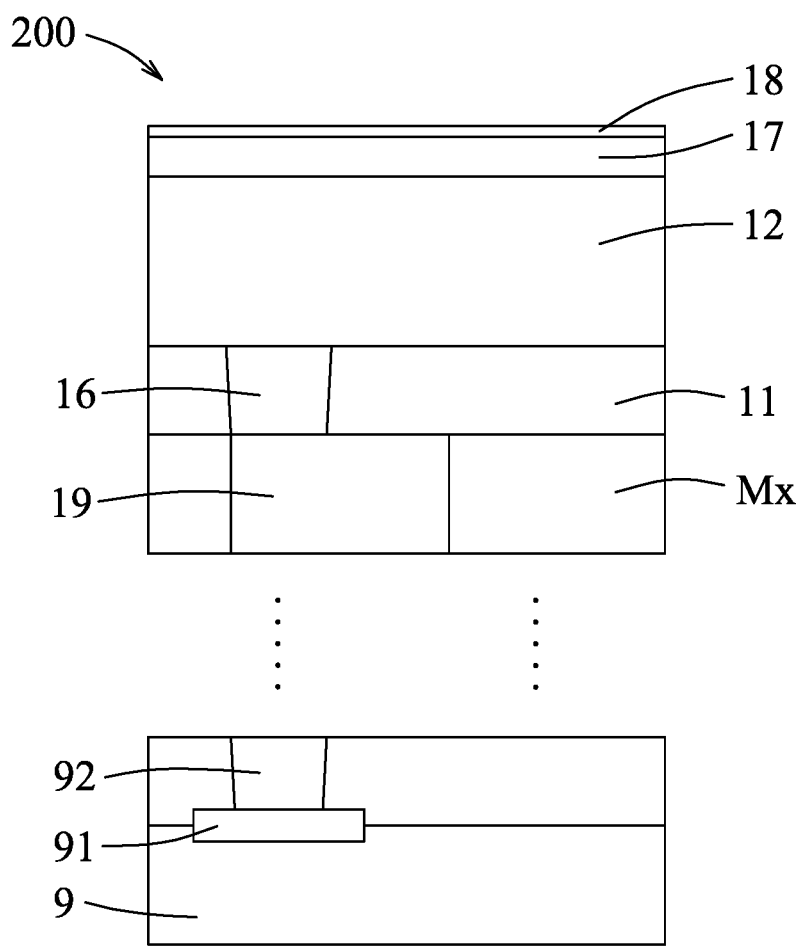
FIGS. 3 to 19 illustrate schematic views showing intermediate stages of the method for manufacturing a semiconductor structure having air gaps as depicted in FIG. 2.

In some embodiments, the substrate 9 may be a semiconductor substrate, e.g., an elemental semiconductor or a compound semiconductor. An elemental semiconductor is composed of single species of atoms, such as silicon (Si) or germanium (Ge) in column IV of the periodic table. A compound semiconductor is composed of two or more elements, such as silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or the like. The compound semiconductor may have a gradient feature in which the composition thereof changes from one ratio at one location to another ratio at another location in the compound semiconductor. The compound semiconductor may be formed over a silicon substrate. The compound semiconductor may be strained. In some embodiments, the substrate 9 may include a multilayer compound semiconductor structure. Alternatively, the substrate 9 may include a non-semiconductor material, such as a glass, fused quartz, or calcium fluoride. Furthermore, in some embodiments, the substrate 9 may be a semiconductor on insulator (SOI) (e.g., silicon germanium on insulator (SGOI)). Generally, an SOI substrate includes a layer of a semiconductor material such as epitaxial silicon (Si), germanium (Ge), silicon germanium (SiGe), or combinations thereof. The substrate may be doped with a p-type dopant, such as boron (Br), aluminum (Al), gallium (Ga), or the like, or may alternatively be doped with an n-type dopant, as is known in the art. In some embodiments, the substrate 9 may include a doped epitaxial layer. Shallow trench isolation (STI) regions (not shown) may be formed in the substrate 9 to isolate active regions (one is schematically shown in FIG. 3 with the numeral 91), such as source or drain regions of an integrated circuit device (not shown) in the substrate 9. In some embodiments, the integrated circuit device may include complementary metal-oxide semiconductor (CMOS) transistors, planar or vertical multi-gate transistors (e.g., FinFET devices), gate-all-around (GAA) devices, resistors, capacitors, diodes, transistors (e.g., field-effect transistors (FETs)), interconnections, or the like, based on practical applications. In addition, through-vias (not shown) may be formed to extend into the substrate 9 for electrically connecting features on opposite sides of the substrate 9.

The interconnect layer 11 includes at least one interconnect 16 (for example, an electrically conductive via) which is electrically connected to at least one metal line 19 in the metal layer (Mx) below the interconnect layer 11, respectively. The active region 91 in the substrate 9 is electrically connected to a metal line 19 through a contact 92. The interconnect layer 11 may be made of a dielectric material, such as silicon oxide, SiOC-based materials (e.g., SiOCH), borophosphosilicate glass (BPSG), undoped silicate glass (USG), fluorinated silicate glass (FSG), high-density plasma (HDP) oxide, fluorine-doped silicon oxide, carbon-doped silicon oxide, porous silicon oxide, porous carbon-doped silicon oxide, organic polymers, or silicone based polymers. In some embodiments, silicon oxide may be formed from tetraethyl orthosilicate (TEOS). The interconnect layer 11 may be formed on the metal layer (Mx) by a suitable deposition process as is known to those skilled in the art of semiconductor fabrication, for example, ALD, chemical vapor deposition (CVD), physical vapor deposition (PVD), or combinations thereof.

The dummy layer 12 may be formed of a suitable metal compound used as a dummy material, for example, titanium nitride, or tungsten carbide, etc., but is not limited thereto.

Materials suitable for forming the first patterned mask layer 13 and the second patterned mask layer 14 independently include, for example, silicon oxide, silicon nitride, silicon carbide, silicon oxycarbide, silicon oxynitride, silicon carbonitride, silicon oxycarbonitride, cobalt, ruthenium, tungsten, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, or combinations thereof, but are not limited thereto.

Figure 4:
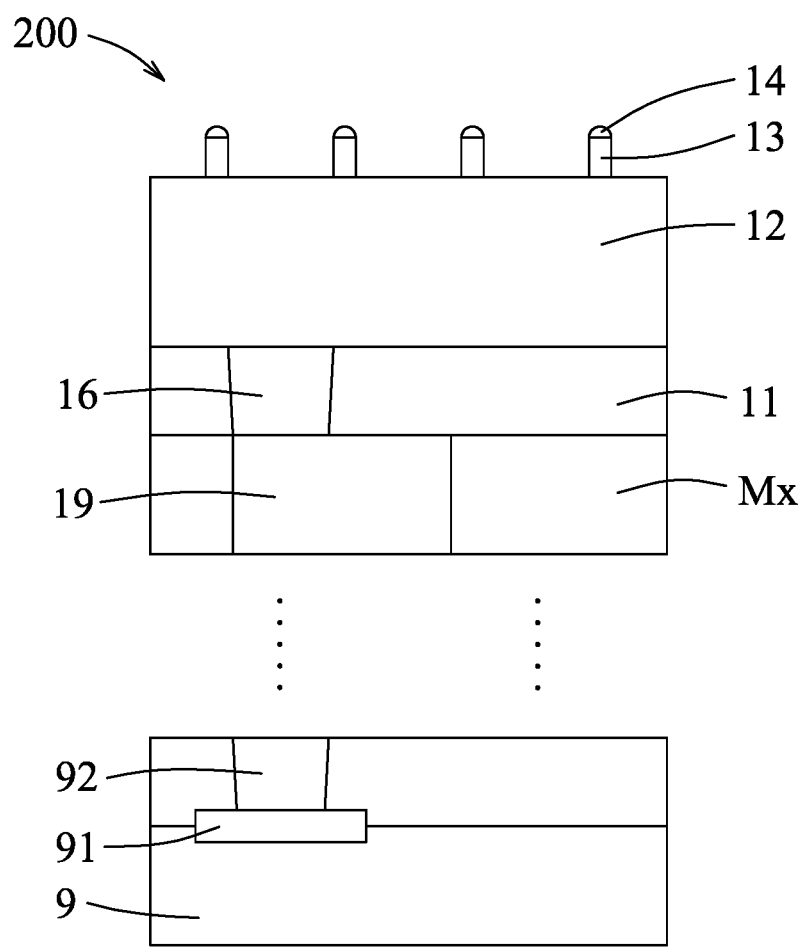
Figure 5:
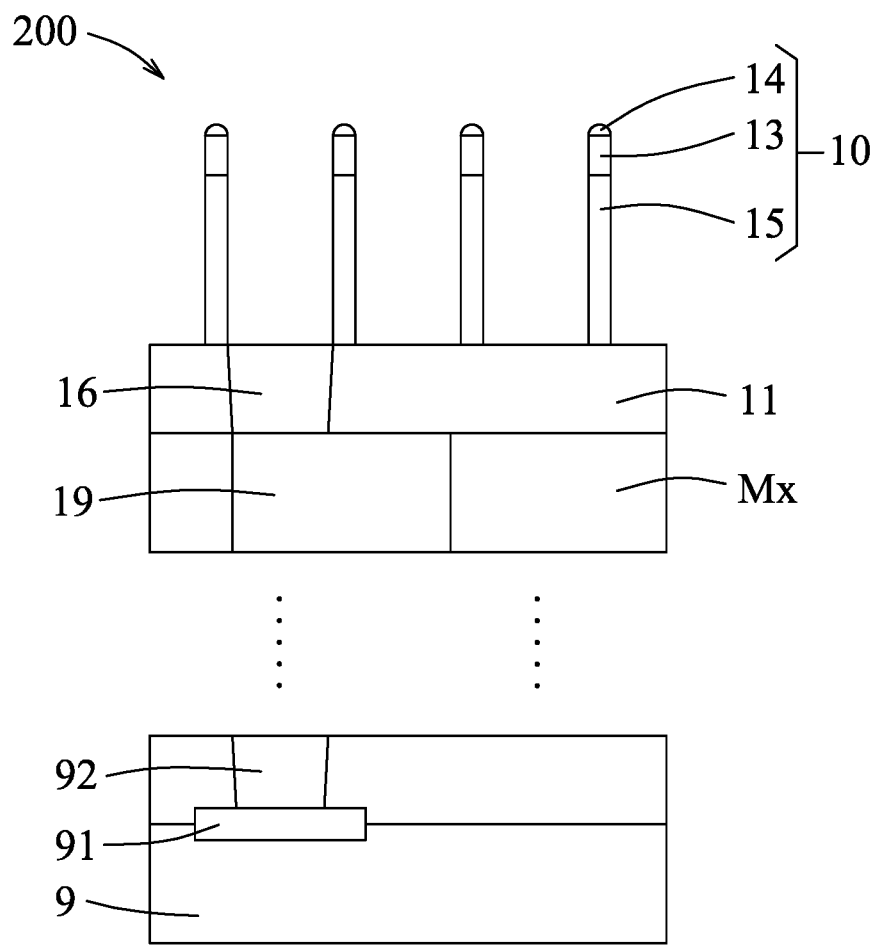

Referring specifically to FIGS. 3 and 4, each of the first patterned mask layer 13 and the second patterned mask layer 14 may be formed from a first mask layer 17 and a second first mask layer 18, respectively using photolithography and photoresist developing technology as is known to those skilled in the art of semiconductor fabrication. For example, the first patterned mask layer 13 and the second patterned mask layer 14 may be formed from the first mask layer 17 and the second mask layer 18, respectively by 193 nm immersion lithography or extreme ultraviolet (EUV) lithography. The pattern formed in the first patterned mask layer 13 and the second patterned mask layer 14 is then transferred to the dummy layer 12 by an etching treatment (for example, wet etching) to form the patterned dummy layer 15.

The method 100 then proceeds to block 104 wherein a deposition layer is formed to cover the laminate structure. Referring to the example illustrated in FIG. 6, the laminate structure 10 is subjected to deposition of a low-k dielectric material thereon to form a deposition layer 20 (for example, a conformal deposition layer) covering the laminate structure 10. The deposition may be implemented by a suitable deposition process as is known to those skilled in the art of semiconductor fabrication, for example, PVD, CVD, plasma-enhanced chemical vapor deposition (PECVD), ALD, plasma-enhanced atomic layer deposition (PEALD), etc., or combinations thereof, but not limited thereto. For example, the deposition may be implemented by ALD at a temperature ranging from 50° C. to 400° C. When the temperature is lower than 50° C., throughput is decreased and undesirable particles may be formed. When the temperature is higher than 400° C., thermal budget (i.e., an integral of a device temperature over a fixed period of time) is increased. Examples of the low-k dielectric material suitable for forming the deposition layer 20 include silicon oxide, silicon nitride, silicon carbide, silicon oxycarbide, silicon oxynitride, silicon carbonitride, silicon oxycarbonitride, or combinations thereof, but are not limited thereto.

Figure 6:
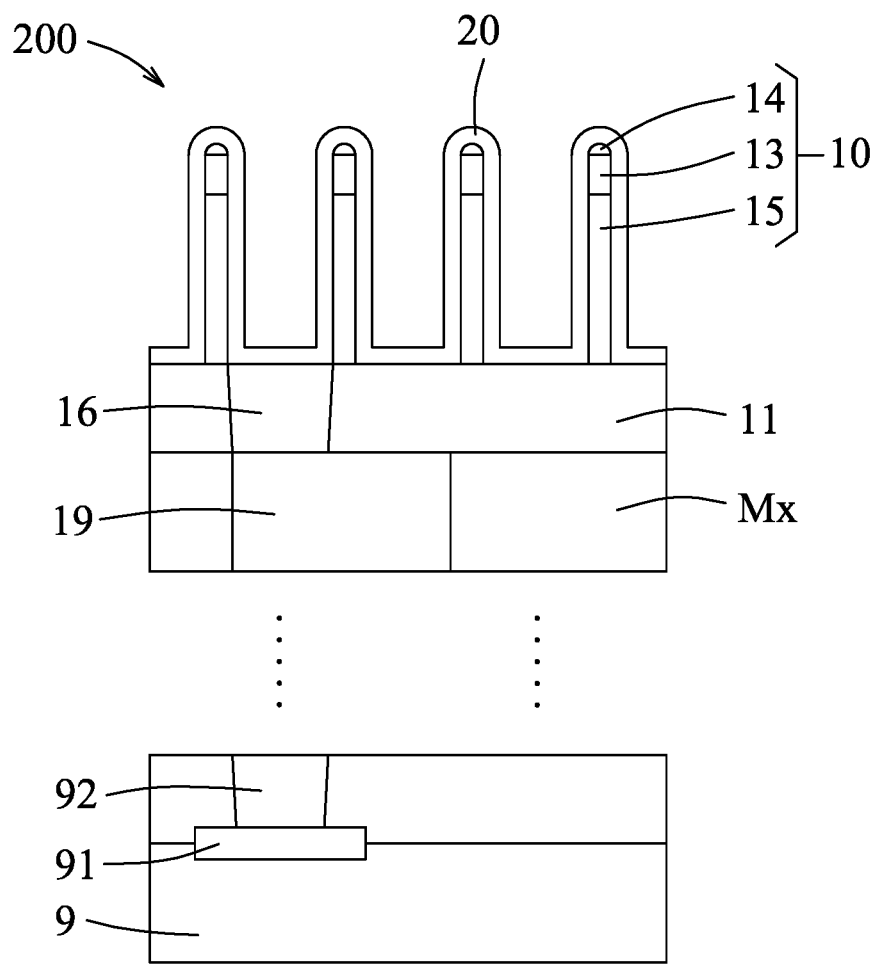
Figure 7:
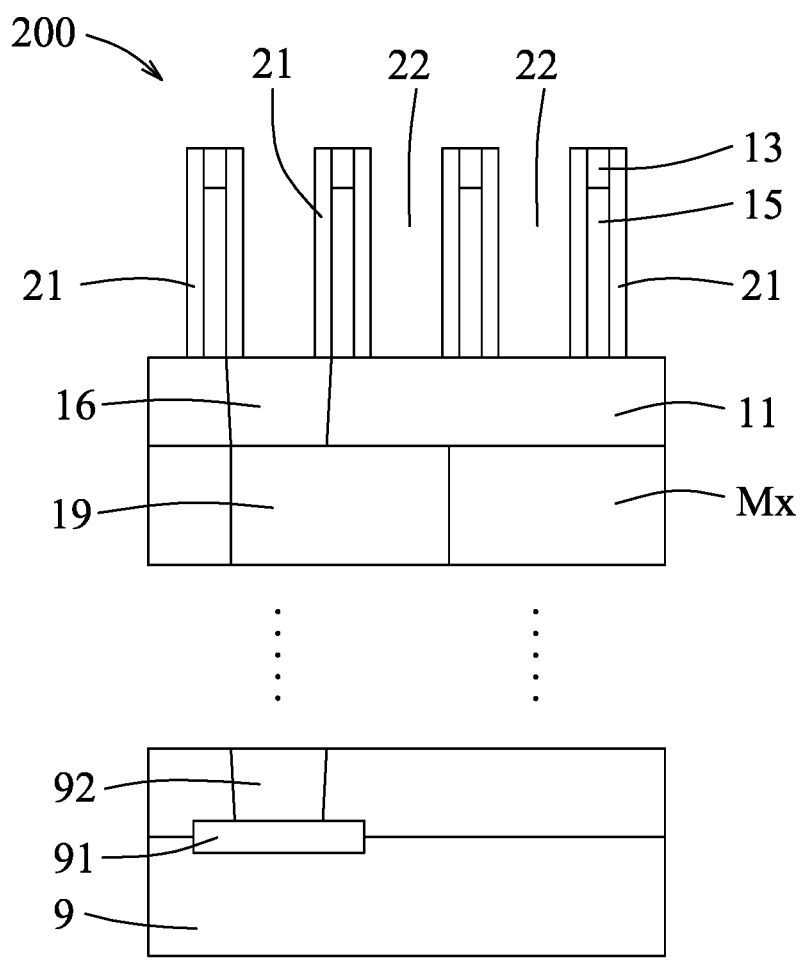
Figure 8:
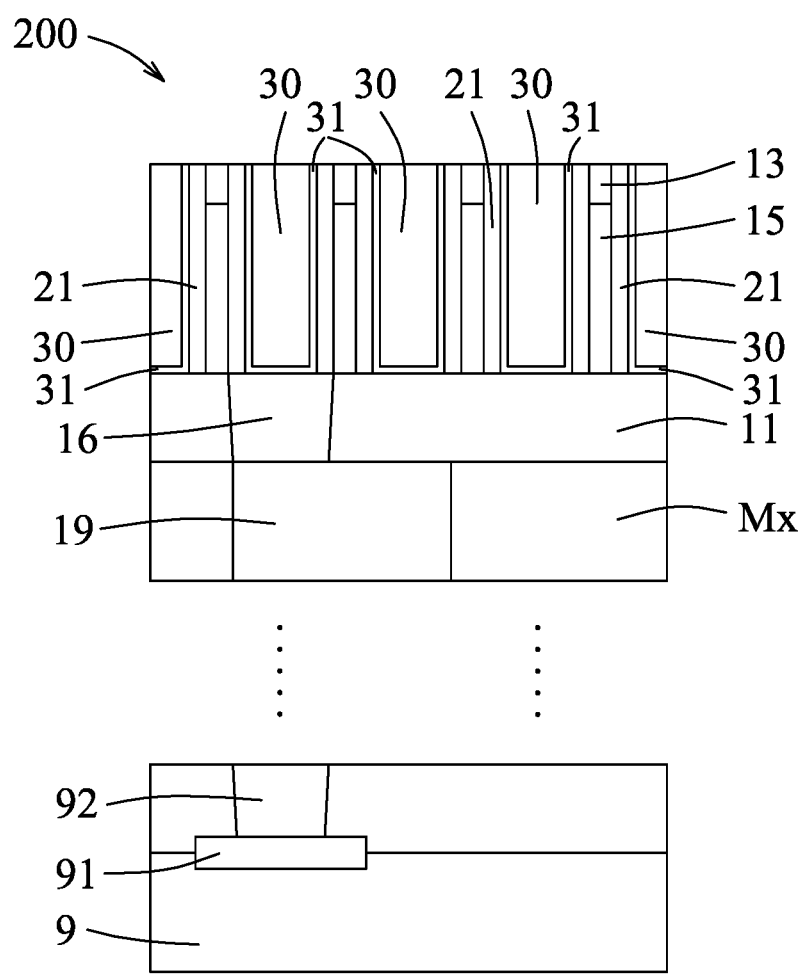
Figure 9:
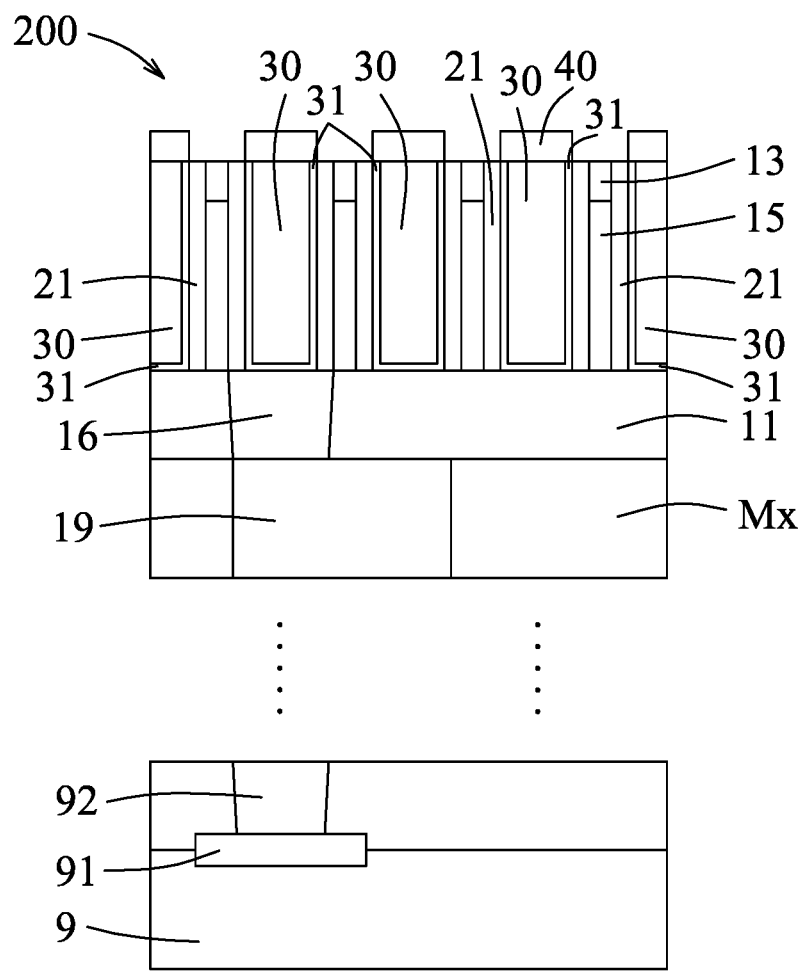
Figure 10:
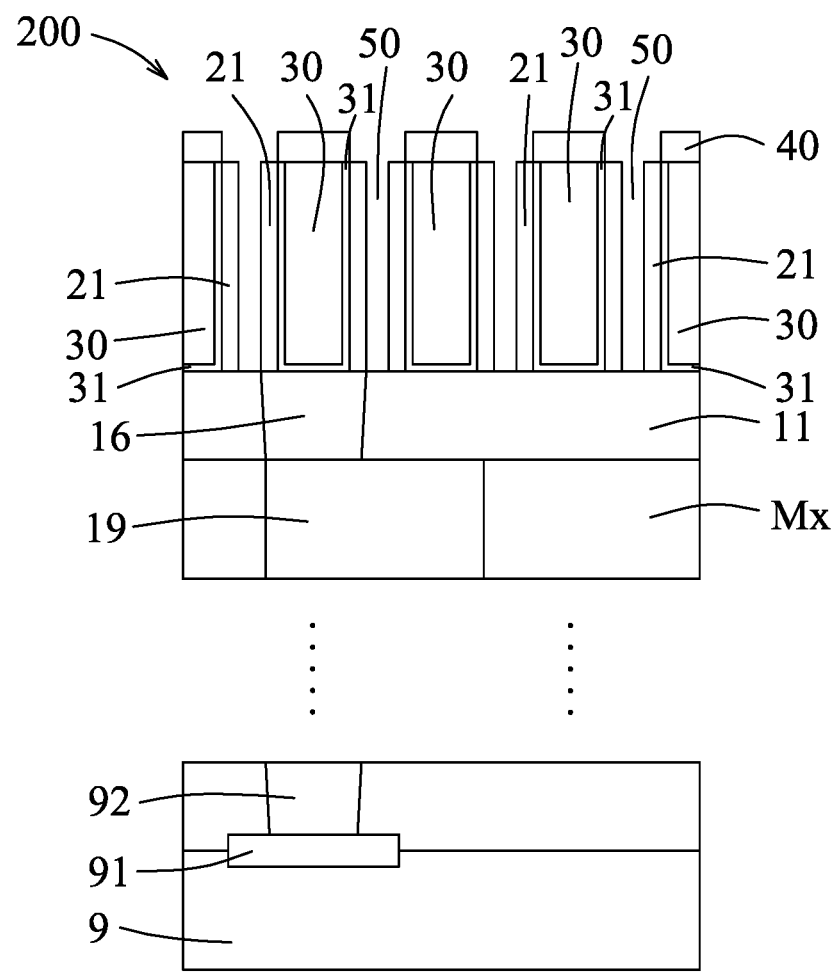
Figure 11:
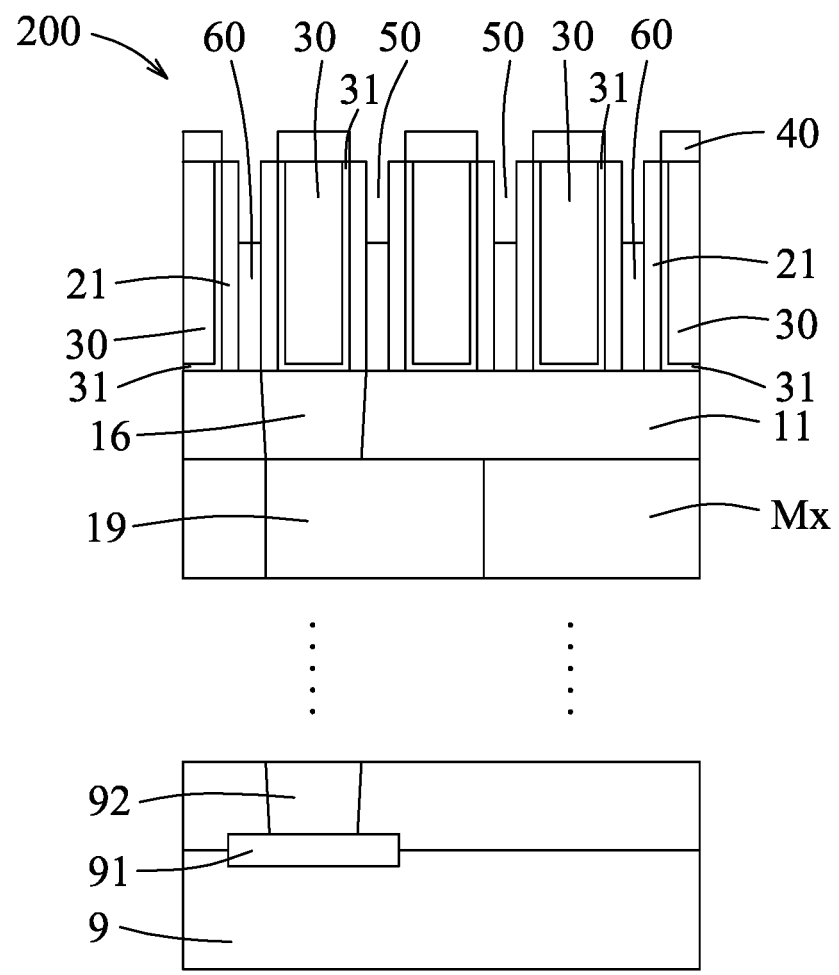
Figure 12:
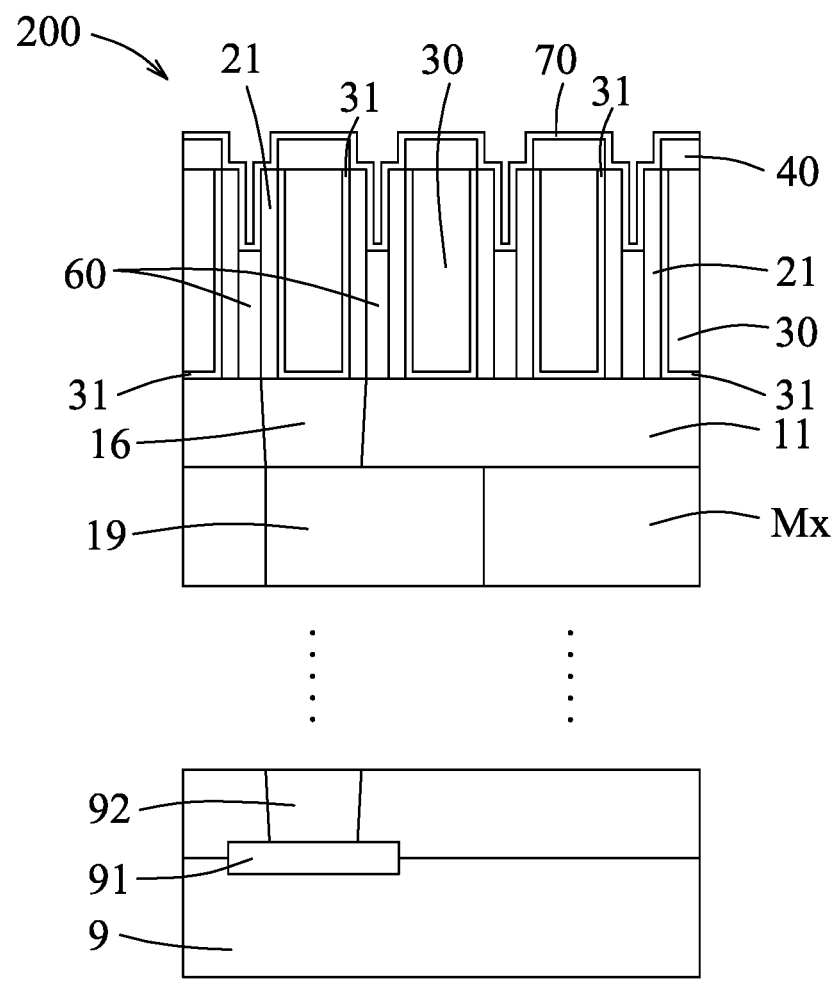

The method 100 then proceeds to block 106 where a plurality of dielectric spacers are formed to define a plurality of trenches. Referring to the example illustrated in FIG. 7, the laminate structure 10 formed with the deposition layer 20 as shown in FIG. 6 is subjected to anisotropic etching to etch away the second patterned mask layer 14 and the horizontal portions of the deposition layer 20, so as to form the deposition layer 20 into a plurality of dielectric spacers 21 extending upwardly from the interconnect layer 11 to define a plurality of trenches 22 and to form a plurality of dummy structures spaced apart from each other. The dummy structures are constituted by the first patterned mask layer 13 and the patterned dummy layer 15. The plurality of the dielectric spacers 21 laterally cover the dummy structures to form the trenches 22 defined by the dielectric spacers 21. The anisotropic etching may be implemented by a suitable anisotropic etching treatment as is known in the art of semiconductor fabrication, such as dry vertical anisotropic etching, but not limited thereto.

The method 100 then proceeds to block 108 where an electrically conductive material is filled into the trenches to form electrically conductive features. Referring to the example illustrated in FIGS. 7 and 8, an electrically conductive material is filled into the trenches 22 to form a plurality of electrically conductive features 30, such as electrically conductive lines.

The electrically conductive material may be, for example, copper (Cu), aluminum (Al), gold (Au), silver (Ag), tungsten (W), cobalt (Co), ruthenium (Ru), molybdenum (Mo), or alloys thereof. The electrically conductive material may be provided as multiple layers having varying composition, and may be filled into the trenches 22 by a suitable process as is known in the art of semiconductor fabrication, such as electroless plating, electroplating, sputter deposition, or CVD, but not limited thereto.

While the electrically conductive material may be a suitable metal or alloy thereof as described above, the method of the present disclosure are particularly adapted to the use of copper (Cu). Electroless plating of copper generally includes forming a seed layer followed by autocatalytic copper deposition. Examples of the material for the seed layer include copper (Cu), nickel (Ni), gold (Au), silver (Ag), palladium (Pd), Iridium (Ir), nickel-palladium-gold (NiPdAu), and nickel-gold (NiAu), but not limited thereto. The seed layer can be formed by a suitable process as is known in the art of semiconductor fabrication, such as electroless deposition, sputtering, or CVD, but not limited thereto. Before filling copper or the like into the trenches 22, the trenches 22 may be lined with a barrier layer 31 that prevents electromigration. Examples of materials for the barrier layer 31 include ruthenium (Ru), manganese (Mn), cobalt (Co), and chromium (Cr), titanium nitride (TiN), titanium tungsten (TiW), tantalum (Ta), tantalum nitride (TaN), tungsten nitride (WN), and combinations thereof. The barrier layer 31 can be deposited by a suitable process, such as CVD.

A planarization treatment, such as chemical mechanical planarization (CMP), is then implemented to permit top surfaces of the electrically conductive features 30 and the dielectric spacers 21 to be horizontally flush with each other.

The method 100 then proceeds to block 110 where a capping layer is formed to cover the electrically conductive features. Referring to the example illustrated in FIG. 9, the electrically conductive features 30 are then subjected to selective deposition of a capping material to form a capping layer 40 such that the electrically conductive features 30 are covered by the capping layer 40 and the dielectric spacers 21. For example, a self-assembled monolayer (SAM) may be selectively formed on the dielectric spacers 21 and the first patterned mask layer 13 to reduce the deposition rate of the capping material on the dielectric spacers 21 and the first patterned mask layer 13 to be lower than the deposition rate of the capping material on the electrically conductive features 30. In some embodiments, the SAM material includes a head group which contains phosphorus (P), sulfur (S), or silicon (Si). In some embodiments, the head group of SAM may include phosphate, sulfate, or silane based materials. In some embodiments, SAM may include benzotriazole (BTA), phosphonic acid, octadecylphosphonic acid (ODPA), organosulfur compound, thiol (e.g., dodecanethiol, alkanethiol, or the like), or the like. In some embodiments, SAM further includes a tail group which is connected to the head group and which contains an organic chain, such as CHx or the like. Thereafter, the capping material may be selectively deposited on the electrically conductive features 30 by a suitable method as is known to those skilled in the art of semiconductor fabrication, such as ALD, CVD, etc., or combinations thereof, to form the capping layer 40. Examples of the capping material suitable for forming the capping layer 40 includes, for example, silicon oxide, silicon nitride, silicon carbide, silicon oxycarbide, silicon oxynitride, silicon carbonitride, silicon oxycarbonitride, cobalt, ruthenium, tungsten, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, and combinations thereof, but are not limited thereto.

The method 100 then proceeds to block 112 where a plurality of recesses are formed. Referring to the example illustrated in FIGS. 9 and 10, the dummy structures (i.e., the patterned dummy layer 15 and the first patterned mask layer 13) are etched away by a suitable etching method as is known to those skilled in the art of semiconductor fabrication, such as an isotropic dry or wet etching method, so as to form a plurality of recesses 50 defined by the dielectric spacers 21.

The method 100 then proceeds to block 114 where a plurality of sacrificial features are formed. Referring to the example illustrated in FIG. 11, a plurality of sacrificial features 60 are formed in the recesses 50, such that each of the sacrificial features 60 has a predetermined height which is less than a height of each of the electrically conductive features 30. Specifically, formation of the sacrificial features 60 may be implemented by the sub-steps of filling a sacrificial material into the recesses 50 to form a sacrificial material layer and subjecting the sacrificial material layer to anisotropic etching until the sacrificial features 60 each having the predetermined height are formed in the recesses 50. In some embodiments, the sacrificial material layer may have a height ranging from 10 Å to 3000 Å. The sacrificial material may be filled into the recesses 50 by a suitable method as is known to those skilled in the art of semiconductor fabrication, such as ALD, CVD, molecular layer deposition (MLD), spin-on deposition, etc., or combinations thereof. The sacrificial material is a sacrificial polymer. Examples of the sacrificial polymer include polyurea, polylactic acid, polycaprolactone, poly(methyl methacrylate), poly(ethylene oxide), and combinations thereof, but are not limited thereto. The anisotropic etching may be suitable anisotropic etching as is known to those skilled in the art of semiconductor fabrication, for example, anisotropic dry etching, but not limited thereto. The predetermined heights of the sacrificial features 60 may be controlled by adjusting the etching time period for the anisotropic etching.

The method 100 then proceeds to block 116 wherein a sustaining layer is formed. Referring to the example illustrated in FIG. 12, a low-k dielectric material is deposited on the capping layer 40, the dielectric spacers 21 and the sacrificial features 60 to form a sustaining layer 70 which has a loose structure and which covers the sacrificial features 60. In some embodiments, the sustaining layer 70 has a porous structure. The deposition for forming the sustaining layer 70 may be implemented by a suitable deposition process as is known to those skilled in the art of semiconductor fabrication, for example, ALD, or CVD, etc., or combinations thereof, but not limited thereto. For example, the deposition may be implemented by ALD at a temperature ranging from 50° C. to 400° C. When the temperature is lower than 50° C., throughput is decreased and undesirable particles may be formed. When the temperature is higher than 400° C., thermal budget is increased. Examples of the low-k dielectric material suitable for forming the sustaining layer 70 include silicon oxide, silicon nitride, silicon carbide, silicon oxycarbide, silicon oxynitride, silicon carbonitride, silicon oxycarbonitride, and combinations thereof, but are not limited thereto.

The method 100 then proceeds to block 118 where the sacrificial features are removed. Referring to the example illustrated in FIGS. 12 and 13, the sacrificial features 60 are removed by diffusing through the porous structure formed in the sustaining layer 70, so as to obtain the semiconductor structure 200 having air gaps 80 which are confined by the sustaining layer 70 and the dielectric spacers 21. In some embodiments in accordance with the present disclosure, the sacrificial features 60 may be removed by a thermal treatment, an ultraviolet treatment, or a combination thereof. In some embodiments, the sacrificial features 60 may be removed by a thermal treatment at a temperature ranging from 50° C. to 400° C. to permit the sacrificial features 60 to vaporize and to degas through the sustaining layer 70. Some ash may be produced after the thermal or ultraviolet treatment, and remains in the air gaps 80. Each of the air gaps 80 thus formed in the semiconductor structure 200 has a height which is less than a height of each of the electrically conductive features 30.

Figure 13:
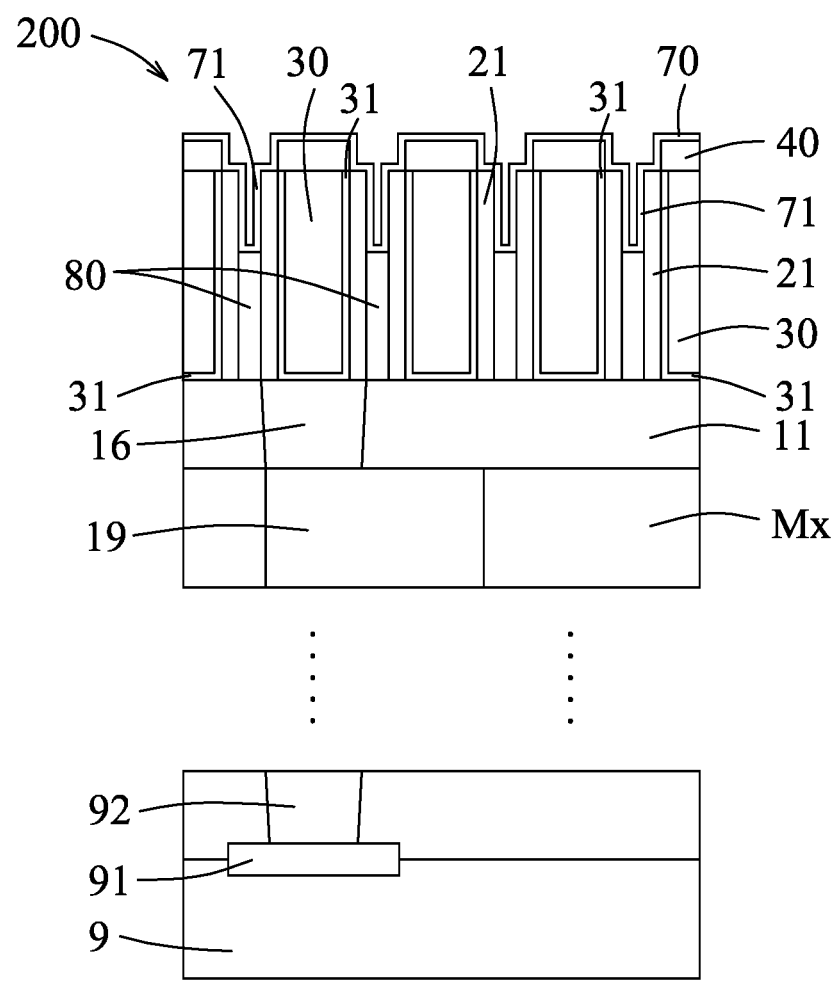

Referring to the example illustrated in FIG. 13, the semiconductor structure 200 in some embodiments includes the interconnect layer 11, a plurality of the electrically conductive features 30, a plurality of the dielectric spacers 21, and the sustaining layer 70. The interconnect layer 11 is disposed on the metal layer (Mx) having the at least one metal line 19, and includes the at least one interconnect 16 (for example, an electrically conductive via) which is electrically connected to the at least one metal line 19 in the metal layer (Mx), respectively. The electrically conductive features 30 extend upwardly from the interconnect layer 11 and are spaced apart from each other. At least one of the electrically conductive features 30 is electrically connected to the at least one interconnect 16, respectively. The dielectric spacers 21 extend upwardly from the interconnect layer 11 along the electrically conductive features 30 so as to laterally cover the electrically conductive features 30 so as to form a plurality of the air gaps 80 defined by the dielectric spacers 21. The sustaining layer 70 is disposed above the electrically conductive features 30 and covers the dielectric spacers 21 and the air gaps 80. The semiconductor structure 200 further includes the capping layer 40 which is disposed on the electrically conductive features 30 and is covered by the sustaining layer 70. The sustaining layer 70 includes a plurality of protruding portions 71 extending downwardly to cap the air gaps 80, respectively, such that each of the air gaps 80 has a height which is less than a height of each of the electrically conductive features 30.

Figure 14:
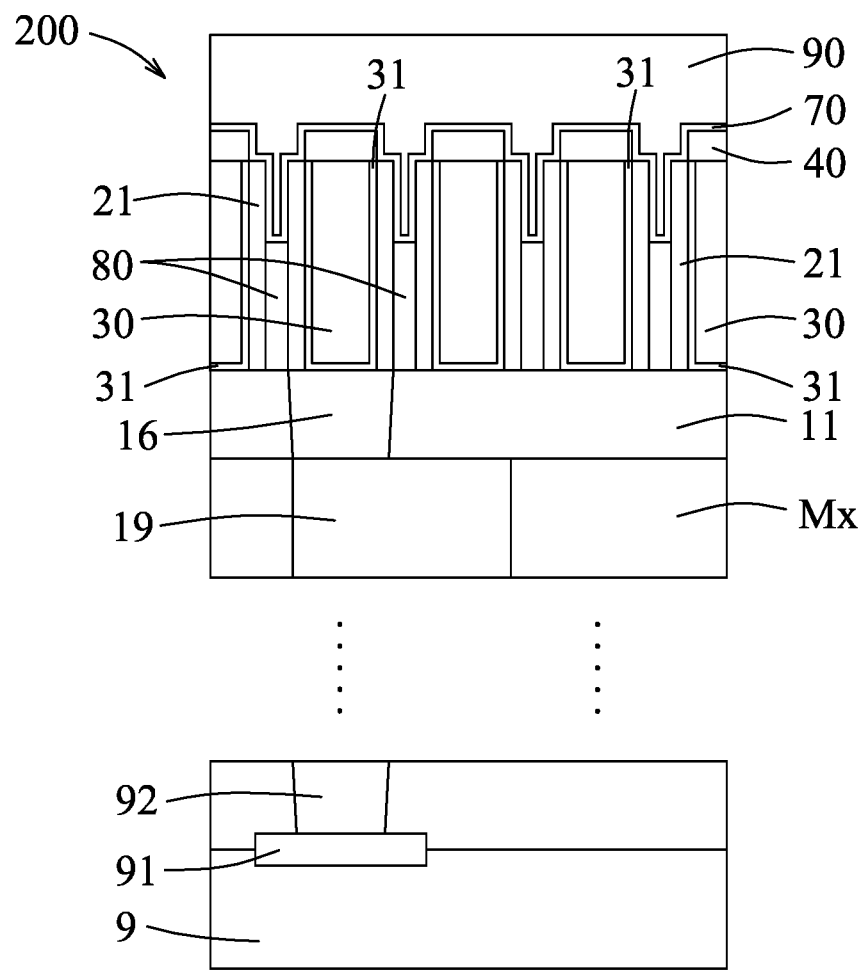
Figure 15:
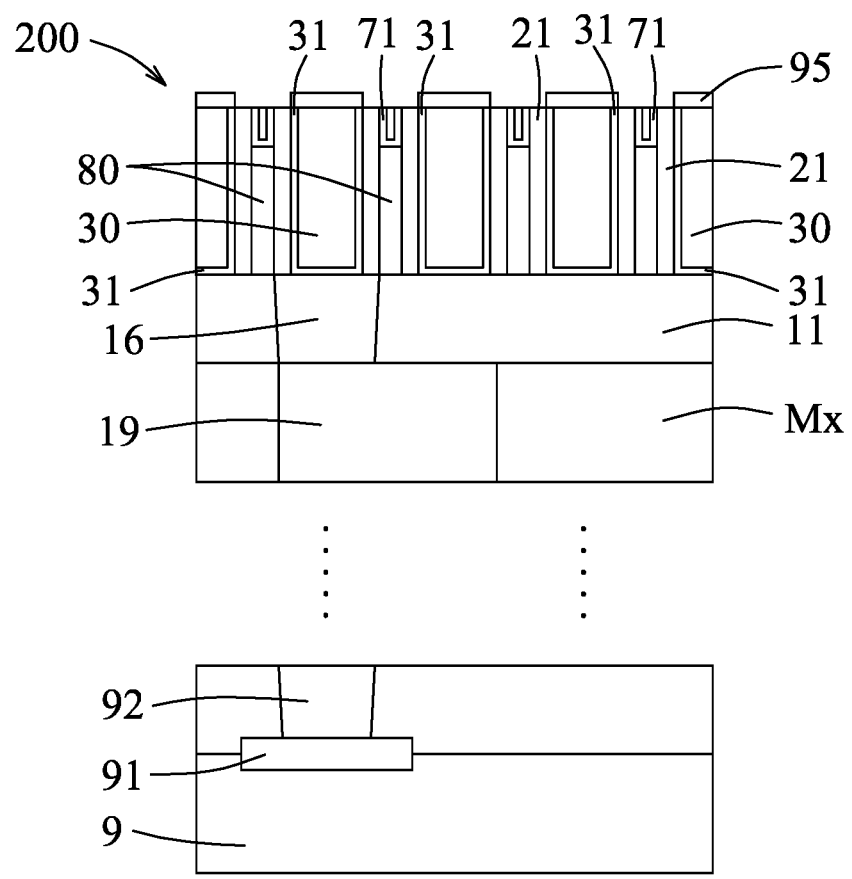

Referring to the example illustrated in FIGS. 14 and 15, a gap-filling material may be further deposited on the sustaining layer 70 by a suitable deposition method such as CVD, ALD, PECVD, PEALD, etc., or combinations thereof, to form a cover layer 90 having a substantially flat top surface and covering the sustaining layer 70. Examples of the gap-filling material include silicon oxide, silicon nitride, silicon carbide, silicon oxycarbide, silicon oxynitride, silicon carbonitride, silicon oxycarbonitride, and combinations thereof, but are not limited thereto. Thereafter, the semiconductor structure 200 formed with the cover layer 90 may be subjected to a suitable planarization process, such as CMP, to remove a portion of the cover layer 90, a portion of the sustaining layer 70, and the capping layer 40 to permit the semiconductor structure 200 to be formed with a substantially flat top surface with the different elements being flush horizontally and to permit the electrically conductive features 30 to be exposed. A metal capping layer 95, such as a cobalt capping layer, may then be selectively deposited on the electrically conductive features 30 by a suitable selective deposition method, such as CVD, using an organometal compound, such as an organocobalt compound, as a precursor.

Figure 16:
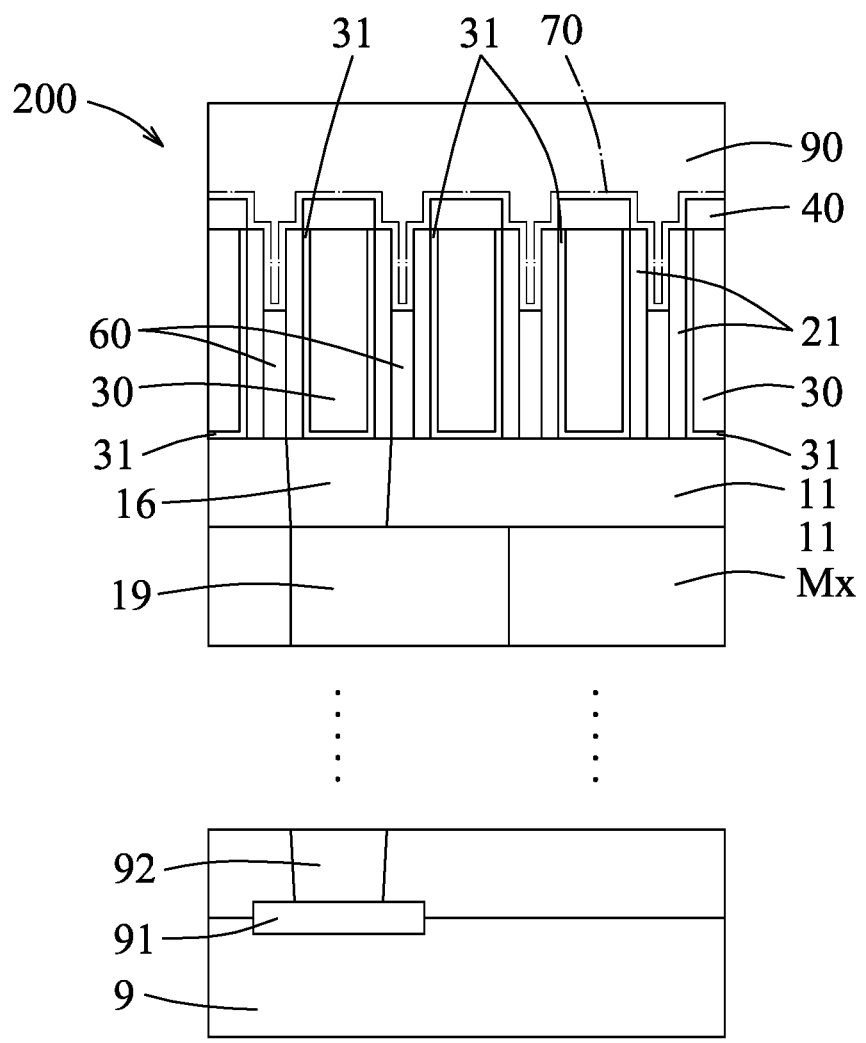
Figure 17:
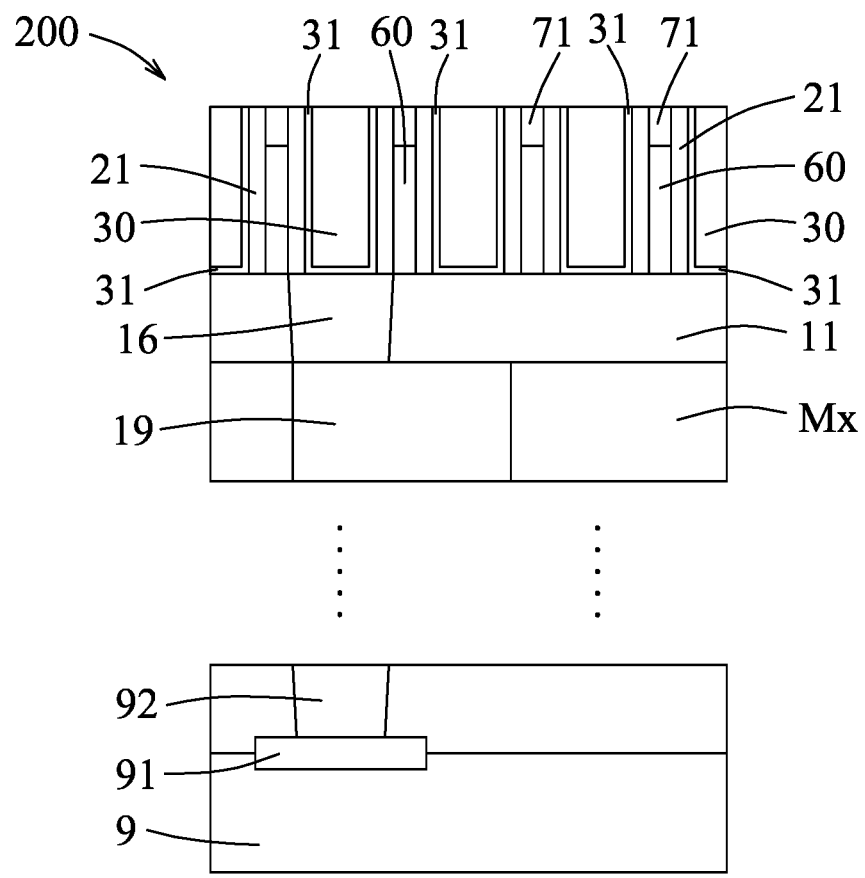
Figure 18:
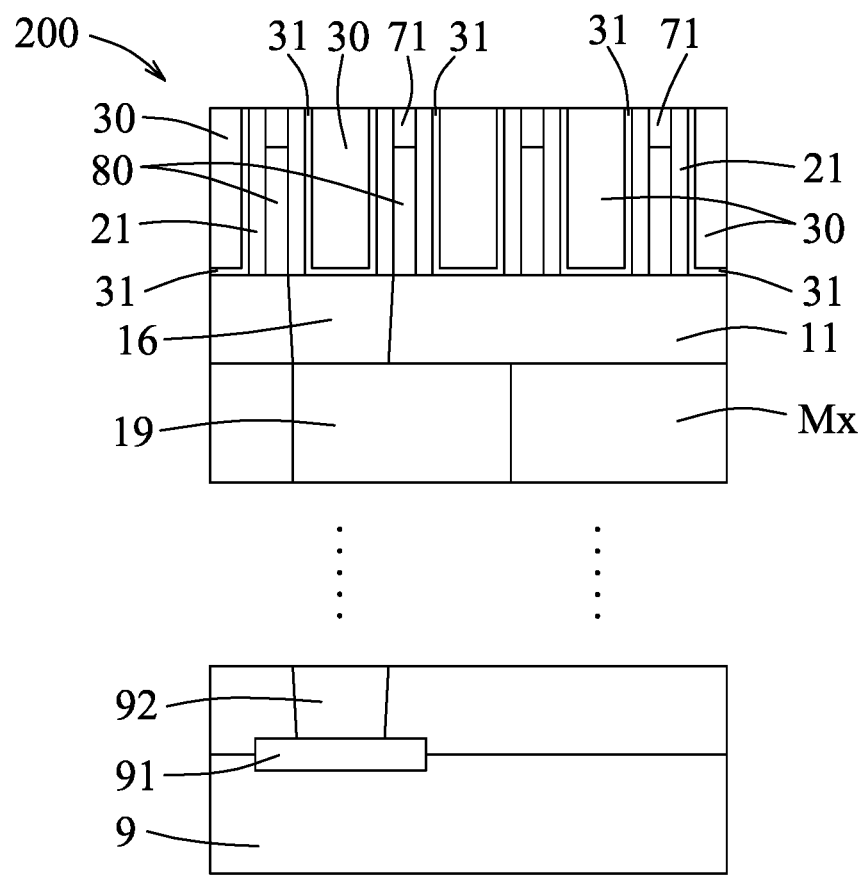
Figure 19:
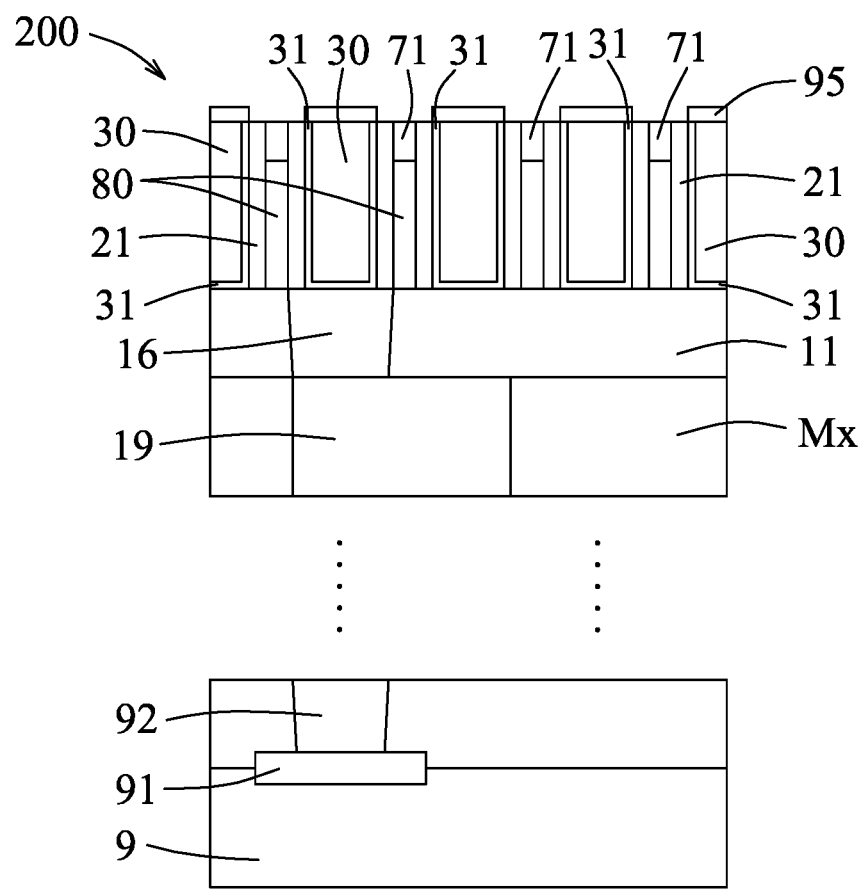

Referring to the example illustrated in FIGS. 16 to 19, in some embodiments, the gap-filling material may be the same material as the low-k dielectric material for forming the sustaining layer 70, so that a single deposition process is performed to form both the sustaining layer 70 and the cover layer 90 by continuously depositing the low-k dielectric material on the capping layer 40, the dielectric spacers 21, and the sacrificial features 60 to permit growth of the cover layer 90 on top of the sustaining layer 70 to have a substantially flat top surface, as specifically shown in FIG. 16. Thereafter, the semiconductor structure 200 formed with the cover layer 90 may be subjected to planarization, such as CMP, to remove a portion of the sustaining layer 70, a portion of the cover layer 90 and the capping layer 40 to permit the semiconductor structure 200 to be formed with a substantially flat top surface with the different elements being flush horizontally and to permit the electrically conductive features 30 to be exposed, as specifically shown in FIG. 17. The sacrificial features 60 are then removed so as to obtain the semiconductor structure 200 having the air gaps 80 which are confined by the protruding portions 71 of the sustaining layer 70 (see FIG. 12) and the dielectric spacers 21, as specifically shown in FIG. 18. As described above, the sacrificial features 60 may be removed by a thermal treatment, an ultraviolet treatment, or a combination thereof. In some embodiments, the sacrificial features 60 may be removed by a thermal treatment at a temperature ranging from 50° C. to 400° C. to permit the sacrificial features 60 to vaporize and to degas through the protruding portions 71 of the sustaining layer 70. In some embodiments, the sacrificial features 60 may be removed by an ultraviolet treatment at an ultraviolet exposure energy density ranging from 10 mJ/cm$^2$ to 100 mJ/cm$^2$ for a time period ranging from 10 seconds to 10 minutes. Some ash may be produced after the thermal or ultraviolet treatment, and remains in the air gaps 80. Each of the air gaps 80 thus formed in the semiconductor structure 200 has a height which is less than a height of each of the electrically conductive features 30. Referring specifically to FIG. 19, the metal capping layer 95, such as the cobalt capping layer, may then be selectively deposited on the electrically conductive features 30 by a suitable deposition process, such as CVD, using the organometal compound, such as the organocobalt compound, as a precursor.

Figure 20:
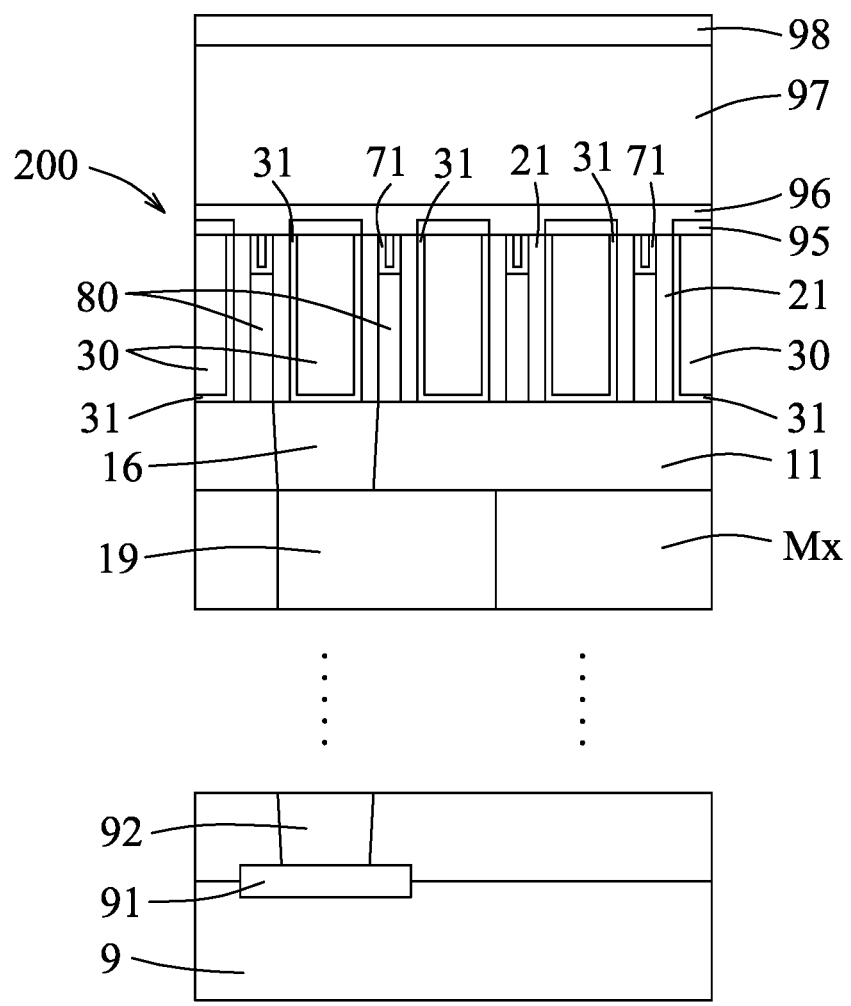
FIGS. 20 to 22 illustrate schematic views showing additional stages for further processing the semiconductor structure having air gaps manufactured in accordance with some embodiments

Referring to FIG. 20, another etch stop layer 96, another dielectric layer 97, and another mask layer 98 are then deposited on the top surface of the semiconductor structure 200 in sequence.

Materials suitable for forming the another etch stop layer 96 include, for example, aluminum compounds (for example, aluminum nitride, aluminum oxynitride, aluminum oxide, etc.), silicon compounds (for example, silicon oxycarbide, silicon carbonitride, silicon nitride, silicon oxycarbonitride, silicon oxide, silicon carbide, silicon oxynitride, etc.), or combinations thereof, but are not limited thereto. The deposition of the another etch stop layer 96 on top surface of the semiconductor structure 200 may be implemented by a suitable deposition process as is known to those skilled in the art of semiconductor fabrication, for example, PVD, CVD, PECVD, ALD, PEALD, etc., or combinations thereof, but not limited thereto.

Materials suitable for forming the another dielectric layer 97 include, for example, silicon-based compounds, such as silicon oxide, silicon nitride, silicon carbide, silicon oxycarbide, silicon oxynitride, silicon carbonitride, silicon oxycarbonitride, or combinations thereof, but are not limited thereto.

Materials suitable for forming the another mask layer 98 include, for example, silicon oxide, silicon nitride, silicon carbide, silicon oxycarbide, silicon oxynitride, silicon carbonitride, silicon oxycarbonitride, cobalt, ruthenium, tungsten, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, or combinations thereof, but are not limited thereto.

Figure 21:
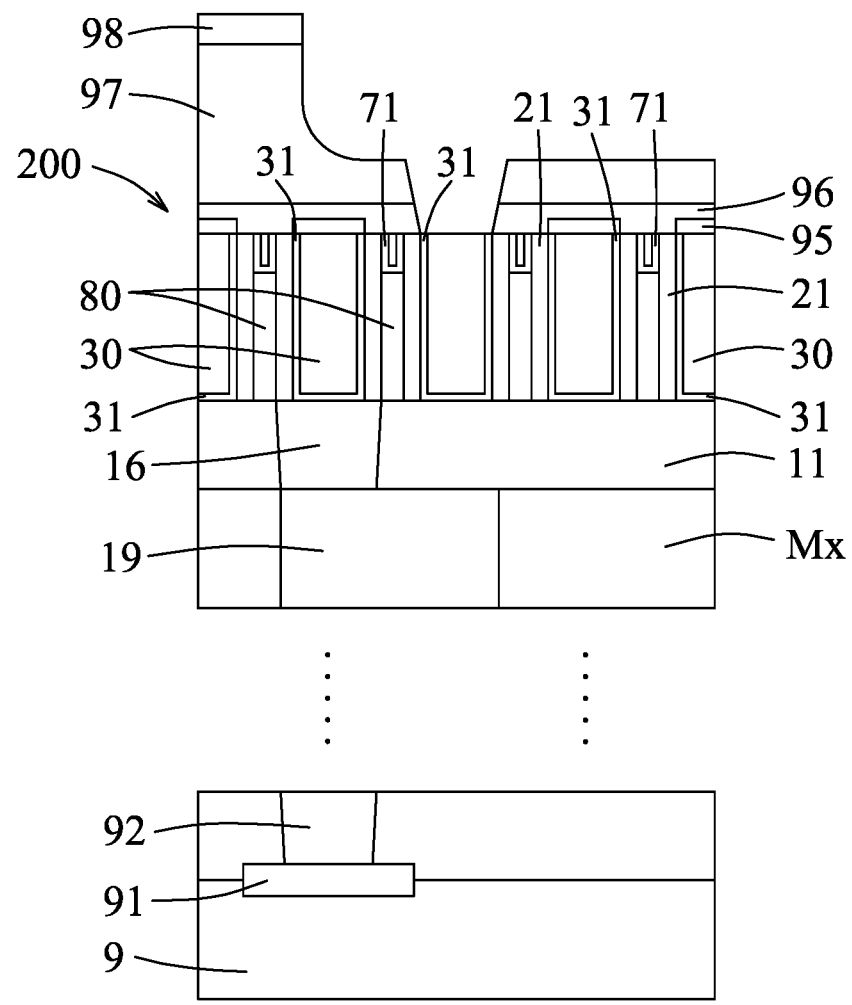

Referring to FIG. 21, the another mask layer 98 is patterned using photolithography and photoresist developing technology as is known to those skilled in the art of semiconductor fabrication. For example, the another mask layer 98 may be patterned by 193 nm immersion lithography or extreme ultraviolet (EUV) lithography. The another dielectric layer 97 and the another etch stop layer 96 are etched sequentially by an etching treatment (for example, wet etching) through the pattern opening of the another mask layer 98 to permit at least one of the electrically conductive features 30 to be exposed.

Figure 22:
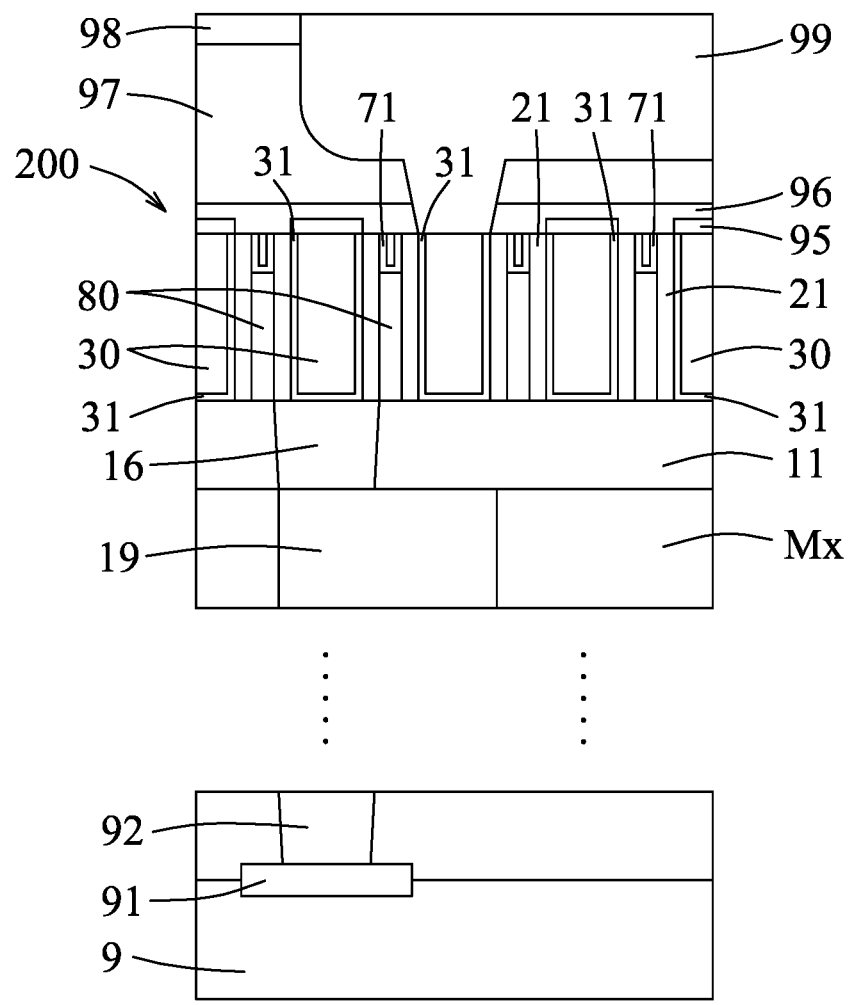

Referring to FIG. 22, at least one another electrically conductive feature 99 (for example, an electrically conductive via) is formed to be electrically connected to the at least one electrically conductive features 30, respectively.

Figure 23:
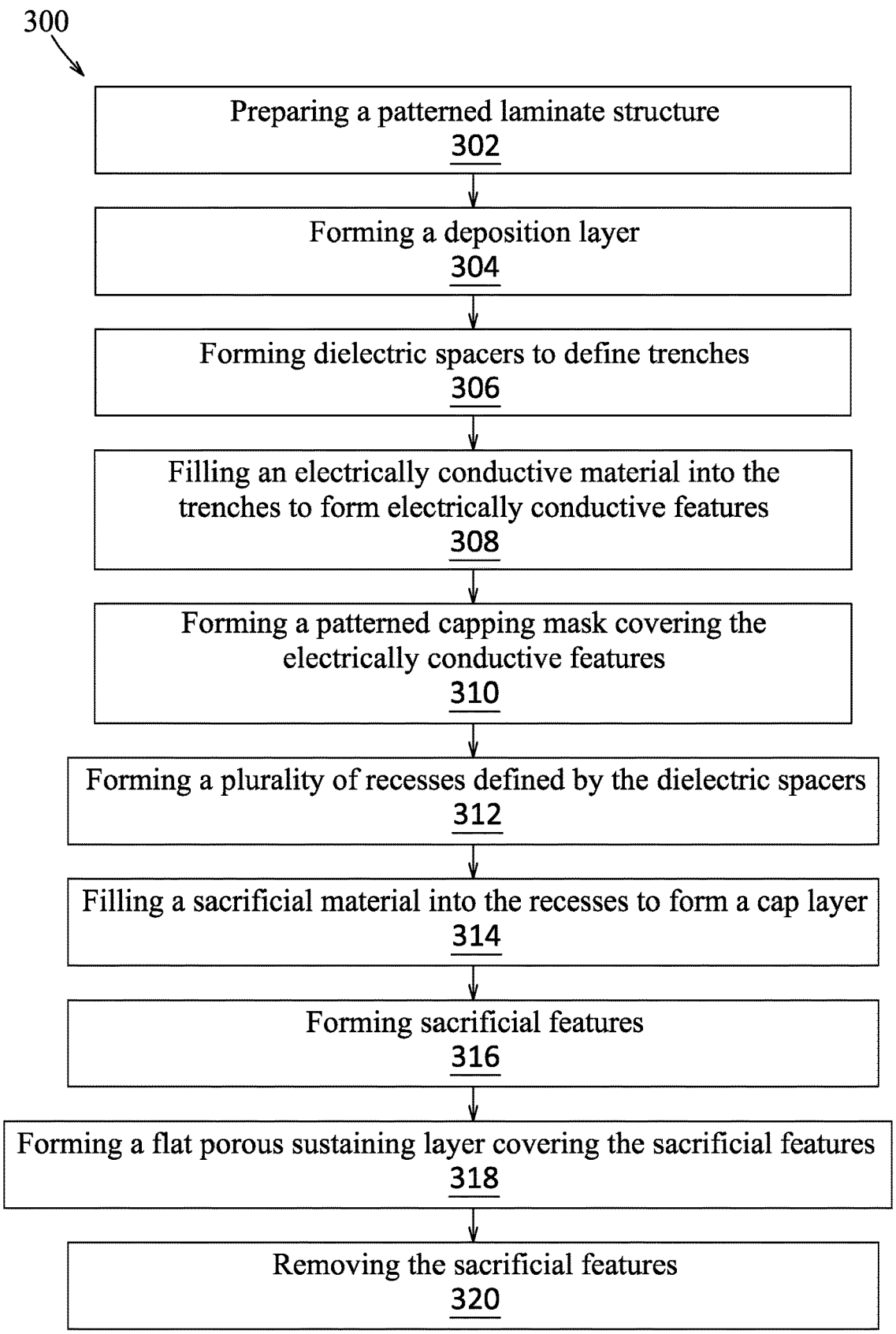
FIG. 23 is a flow diagram illustrating a method for manufacturing a semiconductor structure having air gaps in accordance with some embodiments.
Figure 24:
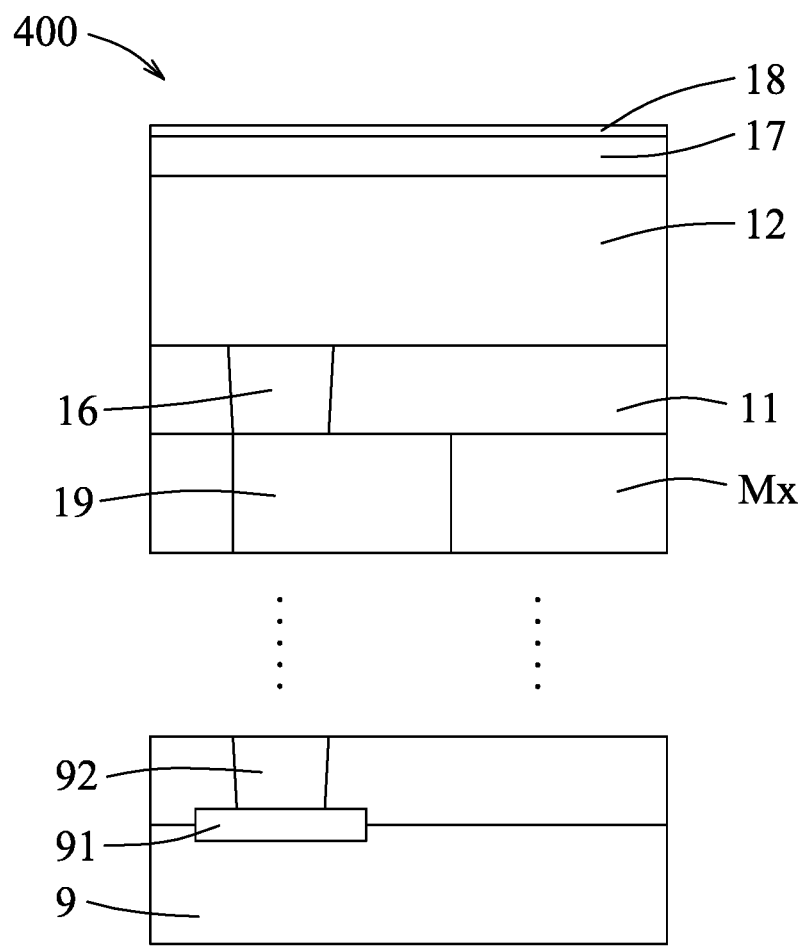
FIGS. 24 to 37 illustrate schematic views showing intermediate stages of the method for manufacturing a semiconductor structure having air gaps as depicted in FIG. 23.
Figure 25:
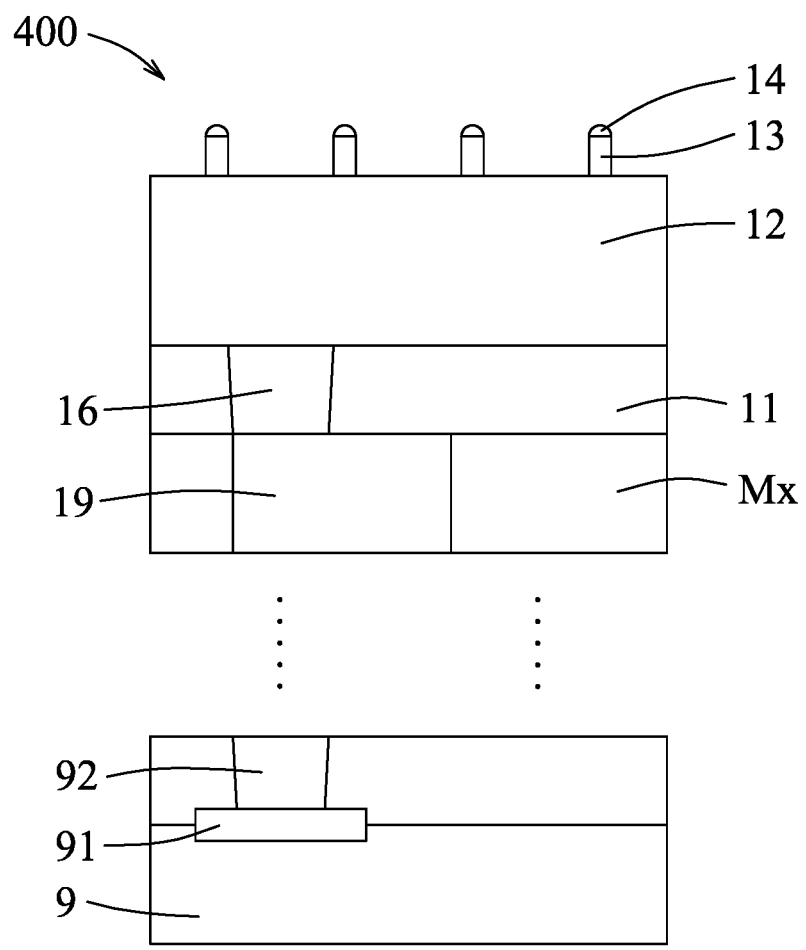
Figure 26:
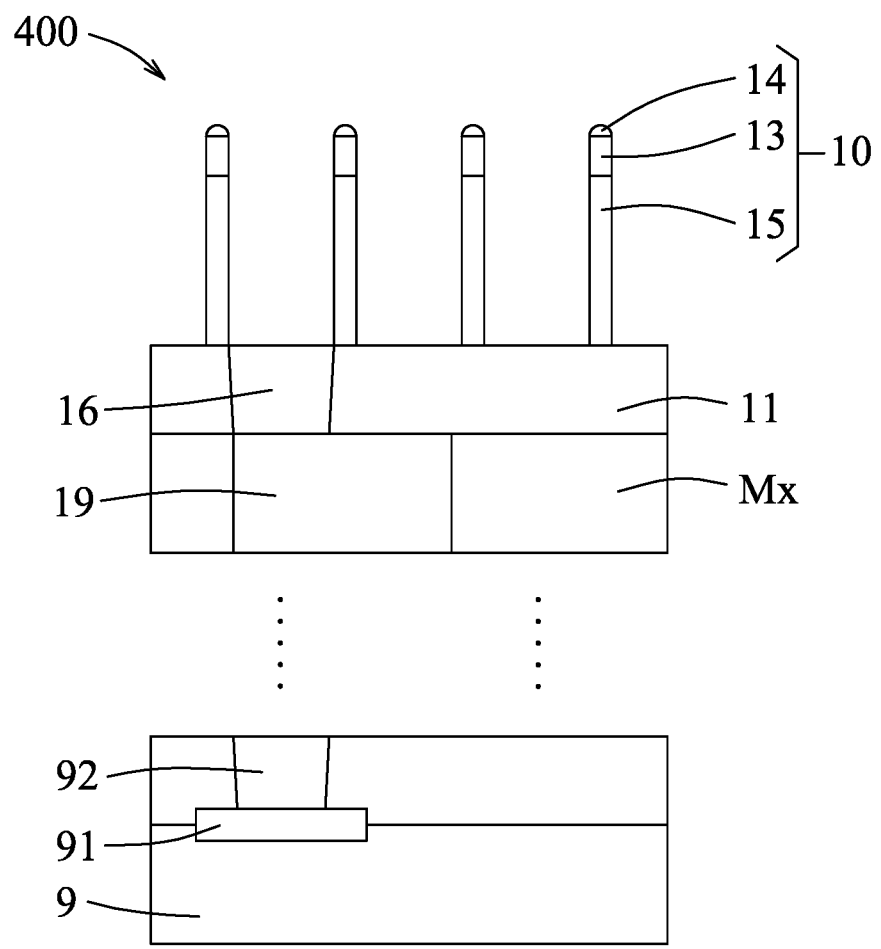

FIG. 23 illustrates a method 300 for manufacturing a semiconductor structure having air gaps in accordance with some embodiments. FIGS. 24 to 36 illustrate schematic views of a semiconductor structure 400 during various stages of the method depicted in FIG. 23. The method 300 and the semiconductor structure 400 are collectively described below. However, additional steps can be provided before, after or during the method 300, and some of the steps described herein may be replaced by other steps or be eliminated. Similarly, further additional features may be present in the semiconductor structure 400, and/or features present may be replaced or eliminated in additional embodiments.

Referring to FIG. 23, the method 300 begins at block 302, where a laminate structure is prepared. Referring to the example illustrated in FIGS. 24 to 26, a laminate structure 10 is prepared on an interconnect layer 11 disposed on a metal layer (Mx) over a substrate 9. Details regarding the preparation of the laminate structure 10 are the same as or similar to those described above with reference to FIGS. 3 to 5.

The method 300 then proceeds to block 304 wherein a deposition layer is formed to cover the laminate structure. Referring to the example illustrated in FIG. 27, the laminate structure 10 is subjected to deposition of a low-k dielectric material thereon to form a deposition layer 20 (for example, a conformal deposition layer) covering the laminate structure 10. Details regarding the formation of the deposition layer 20 are the same as or similar to those described above with reference to FIG. 6.

Figure 27:
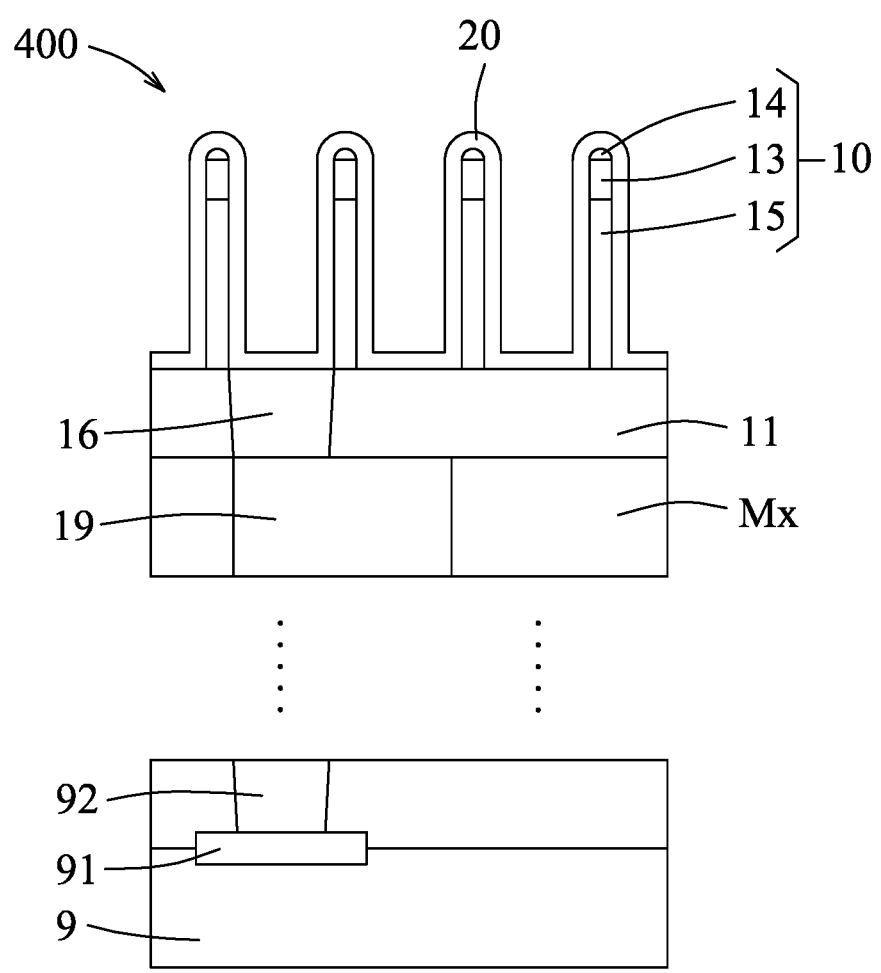
Figure 28:
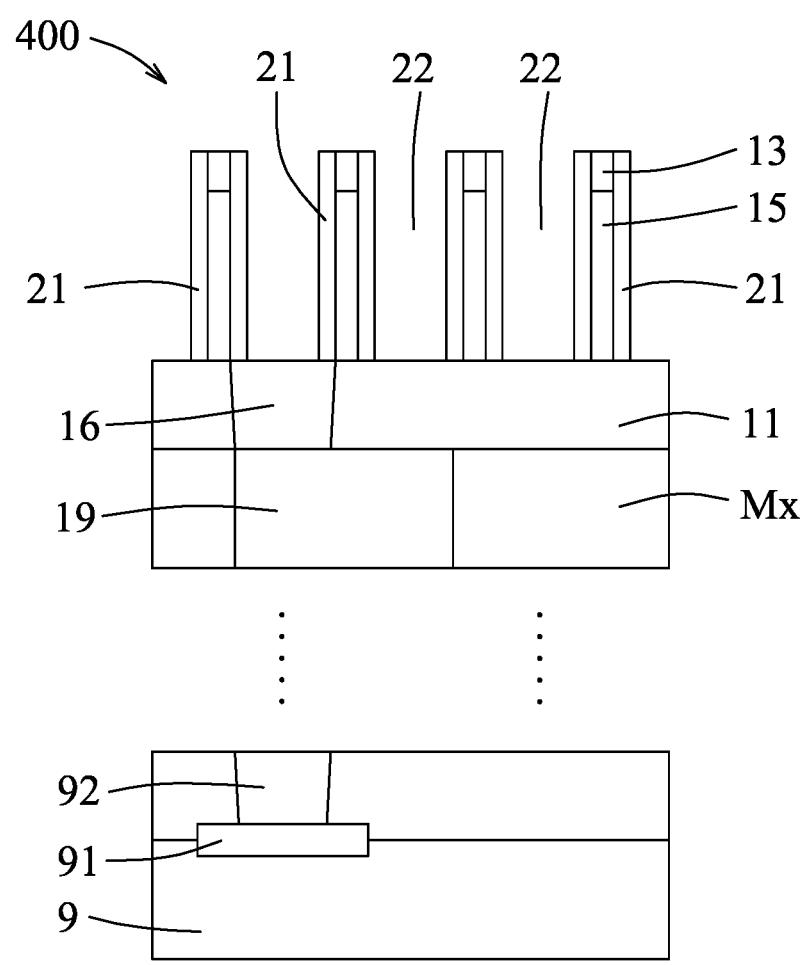
Figure 29:
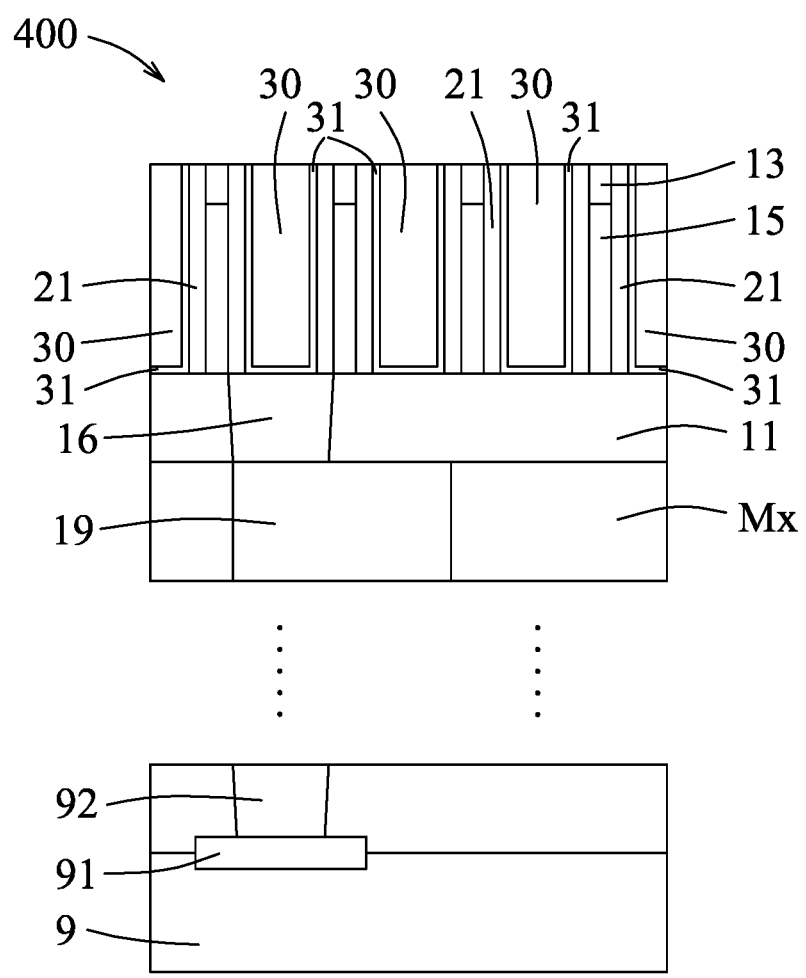
Figure 30:
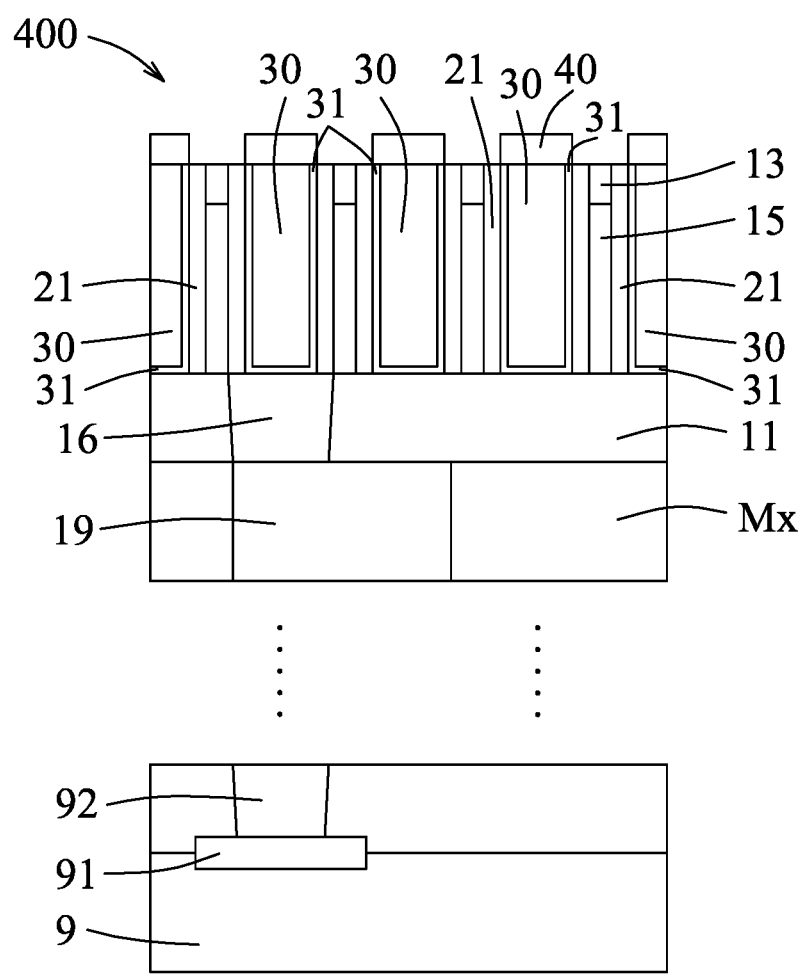
Figure 31:
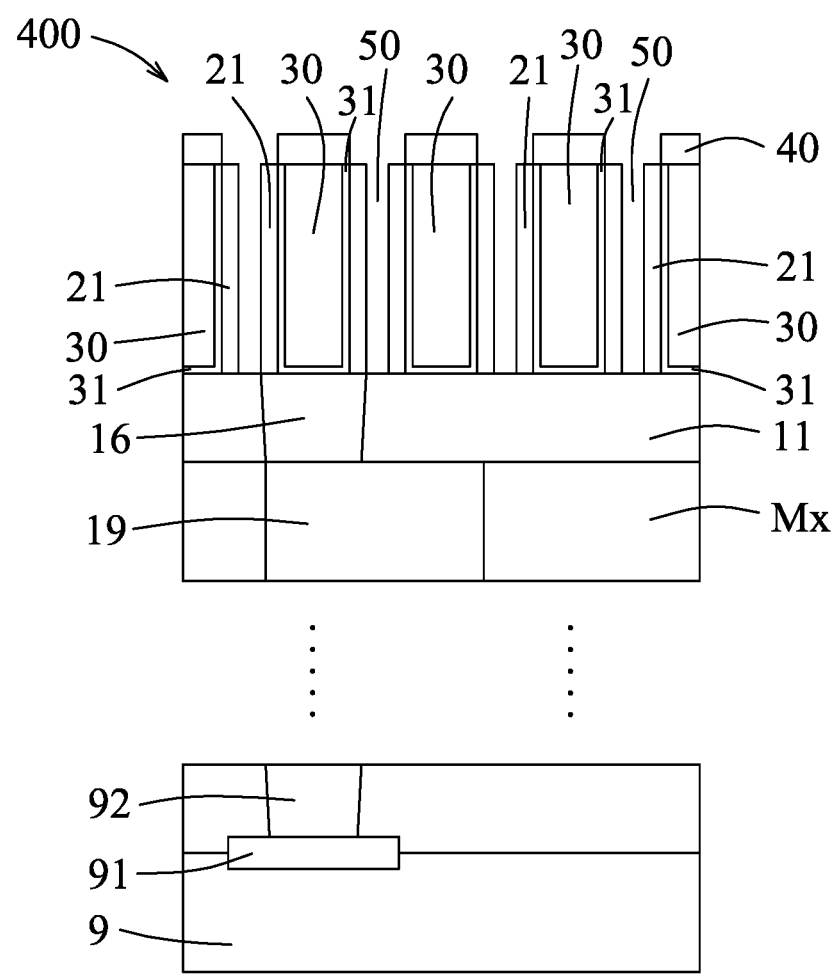
Figure 32:
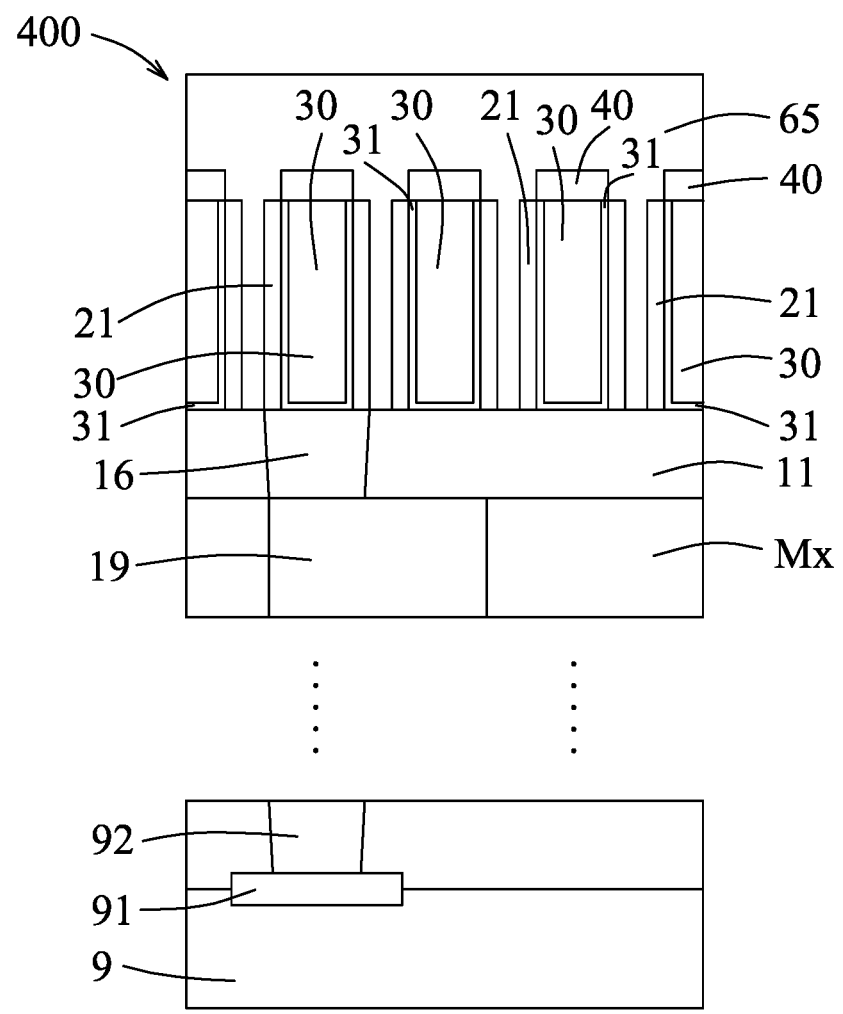
Figure 33:
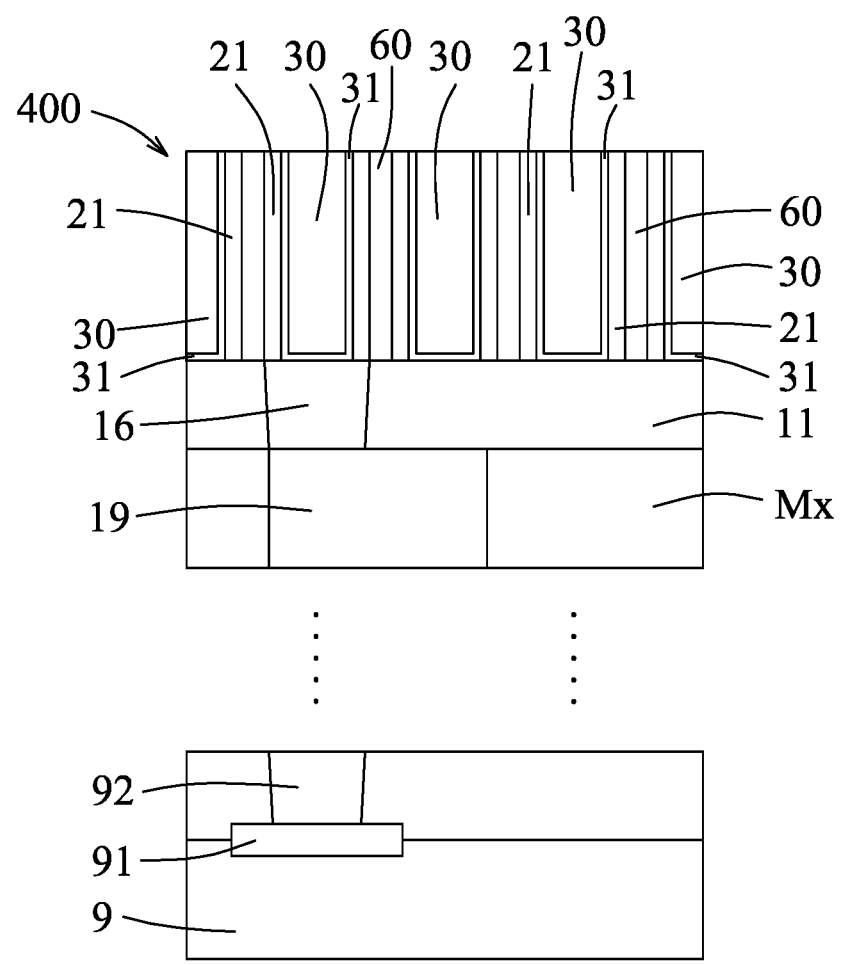
Figure 34:
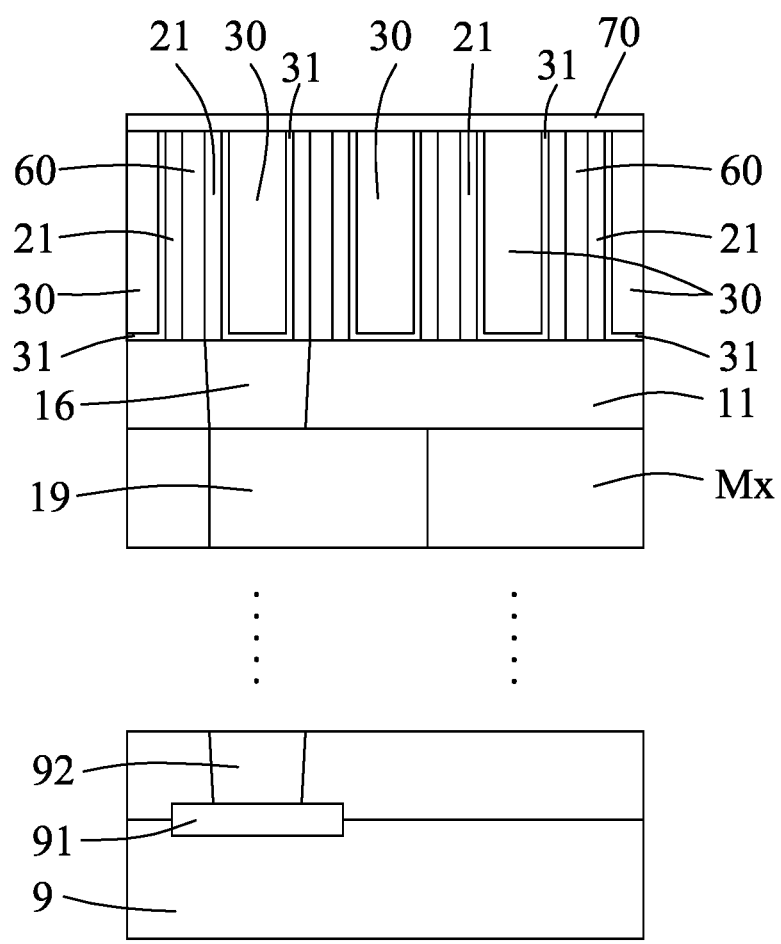

The method 300 then proceeds to block 306 where a plurality of dielectric spacers are formed to define a plurality of trenches. Referring to the example illustrated in FIG. 28, the laminate structure 10 formed with the deposition layer 20 as shown in FIG. 27 is subjected to anisotropic etching to form the deposition layer 20 into a plurality of dielectric spacers 21 which defines a plurality of trenches 22. Details regarding the formation of the dielectric spacers 21 are the same or similar to those described above with reference to FIGS. 6 and 7.

The method 300 then proceeds to block 308 where an electrically conductive material is filled into the trenches to form electrically conductive features. Referring to the example illustrated in FIGS. 28 and 29, an electrically conductive material is filled into the trenches 22 to form a plurality of electrically conductive features 30, such as electrically conductive lines. Details regarding the formation of the electrically conductive features 30 are the same as or similar to those described above with reference to FIGS. 7 and 8.

The method 300 then proceeds to block 310 where a capping layer is formed to cover the electrically conductive features. Referring to the example illustrated in FIG. 30, the electrically conductive features 30 are then subjected to selective deposition of a capping material to form a capping layer 40 such that the electrically conductive features 30 are covered by the capping layer 40 and the dielectric spacers 21. Details regarding the formation of the capping layer 40 are the same as or similar to those described above with reference to FIG. 9.

The method 300 then proceeds to block 312 where a plurality of recesses are formed. Referring to the example illustrated in FIGS. 30 and 31, the dummy structures (i.e., the patterned dummy layer 15 and the first patterned mask layer 13) are etched away by a suitable etching method as is known to those skilled in the art of semiconductor fabrication, such as an isotropic dry or wet etching method, so as to form a plurality of recesses 50 defined by the dielectric spacers 21.

The method 300 then proceeds to block 314 where a sacrificial material is filled into the recesses to form a cover layer. Referring to the example illustrated in FIGS. 31 and 32, a sacrificial material is filled into the recesses 50 and covers the capping layer 40 such that a cover layer 65 made of the sacrificial material is formed in the recesses 50 and on the capping layer 40 and the dielectric spacers 21. The cover layer 65 may be formed by a suitable method as is known to those skilled in the art of semiconductor fabrication, such as ALD, CVD, molecular layer deposition (MLD), spin-on deposition, etc., or combinations thereof. The sacrificial material is a sacrificial polymer. Examples of the sacrificial polymer include polyurea, polylactic acid, polycaprolactone, poly(methyl methacrylate), poly(ethylene oxide), and combinations thereof, but are not limited thereto.

The method 300 then proceeds to block 316 where sacrificial features are formed. Referring to the example illustrated in FIGS. 32 and 33, the capping layer 40 and the cover layer 65 are removed by a suitable planarization process as is known to those skilled in the art of semiconductor fabrication, for example, CMP, to form sacrificial features 60 which are made of the sacrificial material and which have top surfaces horizontally flush with those of the electrically conductive features 30 and the dielectric spacers 21.

The method 300 then proceeds to block 318 where a flat porous sustaining layer is formed. Referring to the example illustrated in FIG. 34, the top surfaces of the sacrificial features 60, the electrically conductive features 30, and the dielectric spacers 21 are subjected to deposition of a low-k dielectric material to form a sustaining layer 70 that is flat and has a porous structure. Details regarding the formation of the sustaining layer 70 are the same or similar to those described above with reference to FIG. 12.

The method 300 then proceeds to block 320 where the sacrificial features are removed. Referring to the example illustrated in FIGS. 34 and 35, the sacrificial features 60 are removed so as to obtain the semiconductor structure 400 having air gaps 80 which are confined by the sustaining layer 70 and the dielectric spacers 21. Details regarding the removal of the sacrificial features 60 are the same or similar to those described above with reference to FIGS. 12 and 13.

Figure 35:
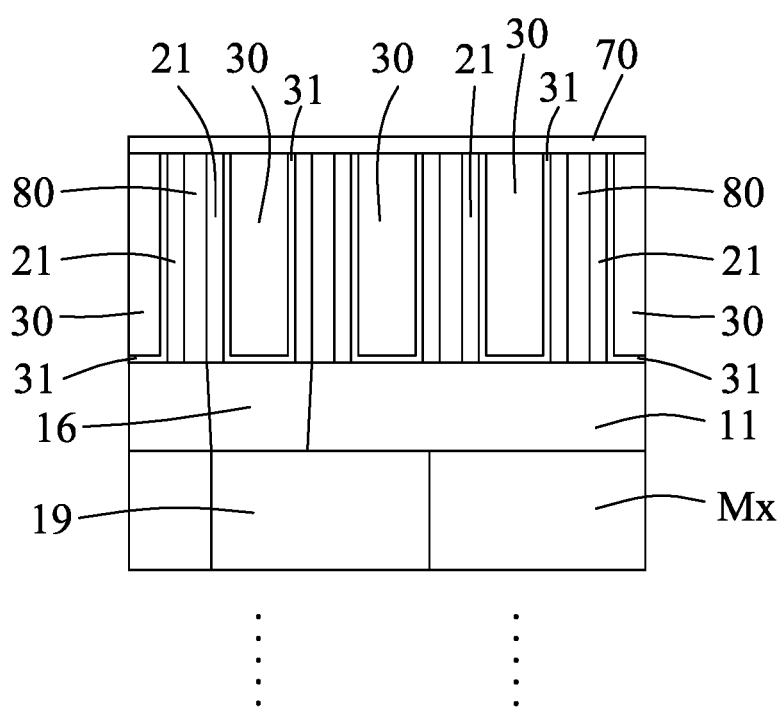

Referring to the example illustrated in FIG. 35, the semiconductor structure 400 in some embodiments includes the interconnect layer 11, a plurality of the electrically conductive features 30, a plurality of the dielectric spacers 21, and the sustaining layer 70. The interconnect layer 11 is disposed on the metal layer (Mx) having the at least one metal line 19, and includes the at least one interconnect 16 (for example, an electrically conductive via) which is electrically connected to the at least one metal line 19 in the metal layer (Mx), respectively. The electrically conductive features 30 extend upwardly from the interconnect layer 11 and are spaced apart from each other. At least one of the electrically conductive features 30 is electrically connected to the at least one interconnect 16, respectively. The dielectric spacers 21 extend upwardly from the interconnect layer 11 along the electrically conductive features 30 to laterally cover the electrically conductive features 30 so as to form a plurality of the air gaps 80 defined by the dielectric spacers 21. The sustaining layer 70 is configured as a flat layer disposed above the electrically conductive features 30 and the dielectric spacers 21 to cover the air gaps 80. The air gaps 80 formed in the semiconductor structure 400 have heights which are the same as those of the electrically conductive features 30.

Figure 36:
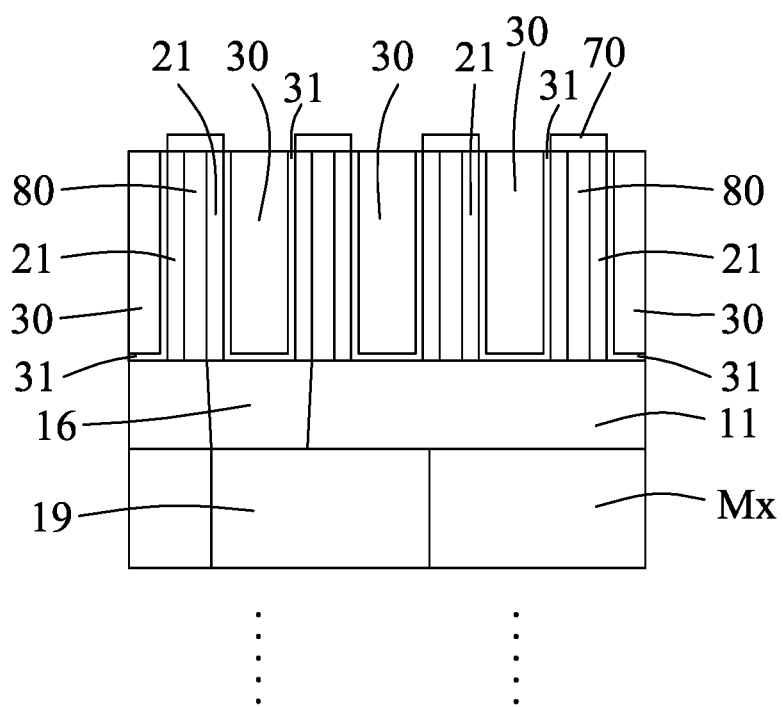
Figure 36:
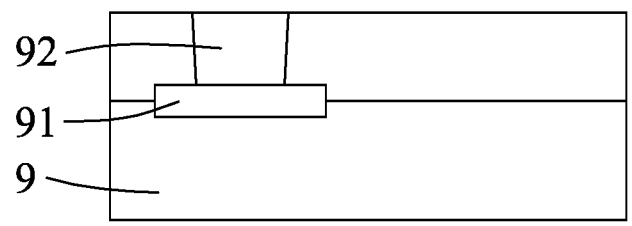

Referring to the example illustrated in FIG. 36, thereafter, the sustaining layer 70 of the semiconductor structure 400 may be patterned using photolithography and photoresist developing technology as is known to those skilled in the art of semiconductor fabrication to permit the electrically conductive features 30 to be exposed.

Figure 37:
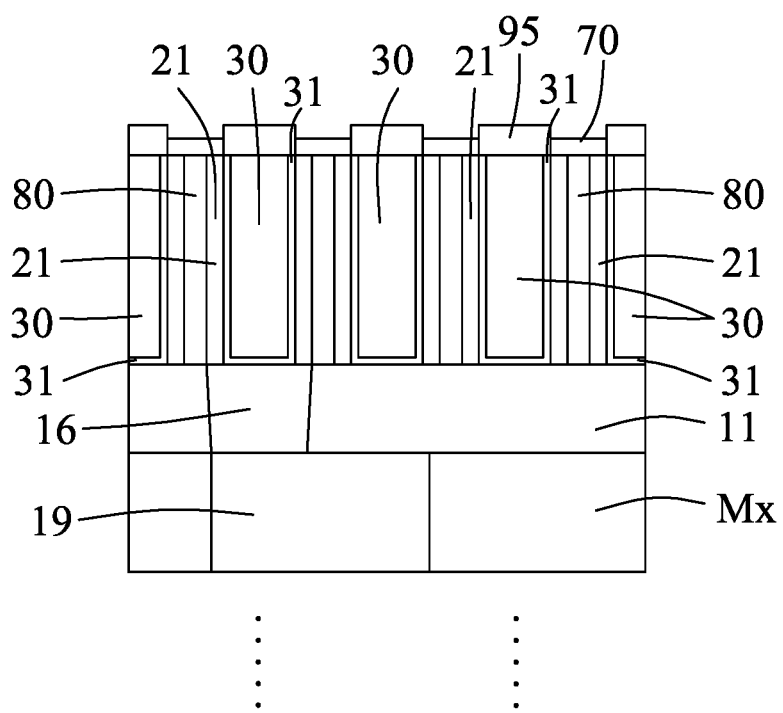

Referring to the example illustrated in FIG. 37, a metal capping layer 95, such as a cobalt capping layer, may then be selectively deposited on the electrically conductive features 30 of the semiconductor structure 400 by a suitable deposition method, such as CVD, using an organometal compound, such as an organocobalt compound, as a precursor.

Thereafter, the semiconductor structure 400 may be further processed according to the stages described above in reference with FIGS. 20 to 22 to form at least one another electrically conductive feature (for example, an electrically conductive via) to be electrically connected to the at least one electrically conductive features 30 of the semiconductor structure 400.

By using the sacrificial material to form the sacrificial features 60, formation of the air gaps 80 in the semiconductor structure 200, 400 can be well controlled. In addition, the dielectric spacers 21 formed from the low-k dielectric material laterally cover the electrically conductive features 30 and the capping layer 40 is formed on the electrically conductive features 30 by subjecting the electrically conductive features 30 to selective deposition of the dielectric material, such that the electrically conductive features 30 are covered and protected by the capping layer 40 and the dielectric spacers 21 so as to prevent the electrically conductive features 30 from damage. Therefore, the RC performance of the semiconductor structure 200, 400 can be further boosted.

In accordance with some embodiments of the present disclosure, a method for manufacturing a semiconductor structure includes forming a plurality of dummy structures spaced apart from each other; forming a plurality of dielectric spacers laterally covering the dummy structures to form a plurality of trenches defined by the dielectric spacers; filling a conductive material into the trenches to form electrically conductive features; selectively depositing a capping material on the electrically conductive features to form a capping layer; removing the dummy structures to form a plurality of recesses defined by the dielectric spacers; filling a sacrificial material into the recesses so as to form sacrificial features; depositing a sustaining layer on the sacrificial features; and removing the sacrificial features to form air gaps confined by the sustaining layer and the dielectric spacers.

In accordance with some embodiments of the present disclosure, a method for manufacturing a semiconductor structure includes forming an interconnect layer including an interconnect; forming a plurality of dummy structures spaced apart from each other on the interconnect layer; forming a plurality of dielectric spacers laterally covering the dummy structures to form a plurality of trenches defined by the dielectric spacers; filling a conductive material into the trenches to form electrically conductive features, one of which is electrically connected to the interconnect; selectively depositing a capping material on the electrically conductive features to form a capping layer; removing the dummy structures to form a plurality of recesses defined by the dielectric spacers; filling a sacrificial material into the recesses so as to form sacrificial features; depositing a sustaining layer on the sacrificial features; and removing the sacrificial features to form air gaps confined by the sustaining layer and the dielectric spacers.

In accordance with some embodiments of the present disclosure, a semiconductor structure includes an interconnect layer, a plurality of electrically conductive features, a plurality of dielectric spacers, and a sustaining layer. The interconnect layer includes an interconnect. The plurality of the electrically conductive features are spaced apart from each other, and one of the electrically conductive features is electrically connected to the interconnect. The plurality of the dielectric spacers laterally cover the electrically conductive features to form a plurality of air gaps defined by the dielectric spacers. The sustaining layer is disposed above the electrically conductive features and covers the dielectric spacers and the air gaps.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a plurality of dummy structures spaced apart from each other;
    forming a plurality of dielectric spacers laterally covering the dummy structures to form a plurality of trenches defined by the dielectric spacers;
    filling a conductive material into the trenches to form electrically conductive features;
    selectively depositing a capping material on the electrically conductive features to form a capping layer;
    removing the dummy structures to form a plurality of recesses defined by the dielectric spacers;
    filling a sacrificial material into the recesses so as to form sacrificial features;
    depositing a sustaining layer on the sacrificial features; and
    removing the sacrificial features to form air gaps confined by the sustaining layer and the dielectric spacers.

2. The method according to claim 1, wherein forming the sacrificial features includes:
    filling the sacrificial material into the recesses; and
    anisotropically etching the sacrificial material until the sacrificial features each having a predetermined height less than a height of each of the electrically conductive features are formed in the recesses.

3. The method according to claim 1, wherein forming the sacrificial features includes:
    filling the sacrificial material into the recesses such that a cover layer made of the sacrificial material is formed to fill the recesses and to cover the capping layer and the dielectric spacers; and
    removing the capping layer and the cover layer to form the sacrificial features having top surfaces horizontally flush with those of the electrically conductive features and the dielectric spacers.

4. The method according to claim 1, wherein the sacrificial features are removed by a treatment selected from a thermal treatment, an ultraviolet treatment, or a combination thereof.

5. The method according to claim 4, wherein the sacrificial features are removed by the thermal treatment at a temperature ranging from 50° C. to 400° C.

6. The method according to claim 1, wherein the sacrificial material is a sacrificial polymer selected from polyurea, polylactic acid, polycaprolactone, poly(methyl methacrylate), poly(ethylene oxide), or combinations thereof.

7. The method according to claim 1, wherein the sustaining layer has a porous structure, and the sacrificial features is removed by diffusing through the porous structure formed in the sustaining layer.

8. The method according to claim 1, wherein the sustaining layer is formed of a first low-k dielectric material selected from silicon oxide, silicon nitride, silicon carbide, silicon oxycarbide, silicon oxynitride, silicon carbonitride, silicon oxycarbonitride, or combinations thereof, and the sustaining layer is formed by a deposition treatment selected from atomic layer deposition, chemical vapor deposition, or a combination thereof.

9. The method according to claim 8, wherein in forming the sustaining layer, a cover layer is further formed by continuously depositing the first low-k dielectric material to permit growth of the cover layer on top of the sustaining layer to have a substantially flat top surface.

10. The method according to claim 9, further comprising, after removing the sacrificial features, removing a portion of the sustaining layer, a portion of the cover layer, and the capping layer to permit the electrically conductive features to be exposed.

11. The method according to claim 1, further comprising, before forming the capping layer, planarizing the electrically conductive features to permit top surfaces of the electrically conductive features and the dielectric spacers to be horizontally flush with each other.

12. The method according to claim 1, wherein forming the plurality of the dielectric spacers is implemented by depositing a second low-k dielectric material on a laminate structure to form a deposition layer, and anisotropically etching the deposition layer to etch away horizontal portions of the deposition layer.

13. The method according to claim 12, wherein the second low-k dielectric material is selected from silicon oxide, silicon nitride, silicon carbide, silicon oxycarbide, silicon oxynitride, silicon carbonitride, silicon oxycarbonitride, or combinations thereof, and the deposition is implemented by a deposition treatment selected from atomic layer deposition, chemical vapor deposition, or a combination thereof.

14. The method according to claim 1, wherein the capping material for forming the capping layer is selected from silicon oxide, silicon nitride, silicon carbide, silicon oxycarbide, silicon oxynitride, silicon carbonitride, silicon oxycarbonitride, cobalt, ruthenium, tungsten, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, or combinations thereof, and the selective deposition is implemented by a deposition treatment selected from a selective atomic layer deposition, a selective chemical vapor deposition, or a combination thereof.

15. A method for manufacturing a semiconductor structure, comprising:
    forming an interconnect layer including an interconnect;
    forming a plurality of dummy structures on the interconnect layer, the plurality of the dummy structures being spaced apart from each other;
    forming a plurality of dielectric spacers laterally covering the dummy structures to form a plurality of trenches defined by the dielectric spacers;
    filling a conductive material into the trenches to form electrically conductive features, one of which is electrically connected to the interconnect;
    selectively depositing a capping material on the electrically conductive features to form a capping layer;
    removing the dummy structures to form a plurality of recesses defined by the dielectric spacers;
    filling a sacrificial material into the recesses so as to form sacrificial features;
    depositing a sustaining layer on the sacrificial features; and
    removing the sacrificial features to form air gaps confined by the sustaining layer and the dielectric spacers.

16. The method according to claim 15, wherein forming the sacrificial features includes:
    filling the sacrificial material into the recesses; and
    anisotropically etching the sacrificial material until the sacrificial features each having a predetermined height less than a height of each of the electrically conductive features are formed in the recesses.

17. The method according to claim 15, wherein forming the sacrificial features includes:
   filling the sacrificial material into the recesses such that a cover layer made of the sacrificial material is formed to fill the recesses and to cover the capping layer and the dielectric spacers; and
   removing the capping layer and the cover layer to form the sacrificial features having top surfaces horizontally flush with those of the electrically conductive features and the dielectric spacers.

18. A method for manufacturing a semiconductor structure, comprising:
   forming a plurality of dummy structures on a substrate, the dummy structures being spaced apart from each other and including a patterned dummy layer;
   forming a plurality of dielectric spacers laterally covering the dummy structures to form a plurality of trenches defined by the dielectric spacers;
   filling a conductive material into the trenches to form electrically conductive features;
   selectively depositing a capping material on the electrically conductive features to form a capping layer; and
   removing the dummy structures to form a plurality of recesses defined by the dielectric spacers.

19. The method according to claim 18, further comprising:
   filling a sacrificial material into the recesses so as to form sacrificial features;
   depositing a sustaining layer on the sacrificial features; and
   removing the sacrificial features to form air gaps confined by the sustaining layer and the dielectric spacers.

20. The method according to claim 19, wherein the sacrificial features are removed by a treatment selected from a thermal treatment, an ultraviolet treatment, or a combination thereof.

* * * * *